United States Patent
Mizoguchi

(10) Patent No.: US 8,441,263 B2
(45) Date of Patent: May 14, 2013

(54) VOLTAGE MONITOR WITH SELF DIAGNOSTIC FUNCTION

(75) Inventor: Tomomichi Mizoguchi, Nagoya (JP)

(73) Assignee: Denso Corporation, Kariya (JP)

( * ) Notice: Subject to any disclaimer, the term of this patent is extended or adjusted under 35 U.S.C. 154(b) by 451 days.

(21) Appl. No.: 12/892,053

(22) Filed: Sep. 28, 2010

(65) Prior Publication Data

US 2011/0074435 A1    Mar. 31, 2011

(30) Foreign Application Priority Data

Sep. 29, 2009    (JP) ................................ 2009-224953

(51) Int. Cl.
    *G01N 27/28*    (2006.01)
    *H02J 7/16*    (2006.01)
    *H02J 7/00*    (2006.01)

(52) U.S. Cl.
    USPC ........... 324/433; 324/426; 320/151; 320/152; 320/153; 320/156; 320/165; 307/66

(58) Field of Classification Search .................... 324/433
    See application file for complete search history.

(56) References Cited

U.S. PATENT DOCUMENTS

| | | | |
|---|---|---|---|
| 2004/0001996 A1* | 1/2004 | Sugimoto | 429/61 |
| 2004/0041569 A1* | 3/2004 | Furukawa | 324/433 |
| 2004/0113630 A1* | 6/2004 | Sudou | 324/433 |
| 2005/0248351 A1* | 11/2005 | Graf | 324/433 |
| 2008/0169820 A1* | 7/2008 | Nishimoto | 324/433 |
| 2009/0174411 A1* | 7/2009 | Yudahira et al. | 324/433 |
| 2012/0001639 A1 | 1/2012 | Mizoguchi et al. | |

FOREIGN PATENT DOCUMENTS

| | | |
|---|---|---|
| JP | 2003-092840 | 3/2003 |
| JP | P2011-078163 A | 4/2011 |
| JP | P2011-078165 A | 4/2011 |

OTHER PUBLICATIONS

U.S. Appl. No. 13/499,084 of Tanigawa et al, filed Mar. 29, 2012 (corresponds to JP 2011-078163A).
U.S. Appl. No. 13/206,841 of Mizoguchi et al, filed Aug. 10, 2011 (corresponds to JP 2011-078165A).

* cited by examiner

*Primary Examiner* — Yalkew Fantu
(74) *Attorney, Agent, or Firm* — Nixon & Vanderhye PC

(57) ABSTRACT

In a voltage monitor, an abnormality detecting unit receives first information outputted from a first obtaining unit and second information outputted from a second obtaining unit, and determines that an abnormality that affects on at least one of first and second diagnostic thresholds arises in the voltage monitor when the first information is different from the second information. The abnormality detecting unit receives a first forced signal outputted from a first forced-output unit and a second forced signal outputted from a second forced-output unit. The abnormality detecting unit determines whether a timing at which the level of the first diagnostic threshold is switched for each step is deviated from a timing at which the level of the second diagnostic threshold is switched for a corresponding step based on a result of a comparison between the first forced signal and the second forced signal.

12 Claims, 5 Drawing Sheets

VOLTAGE MONITOR WITH SELF DIAGNOSTIC FUNCTION

CROSS REFERENCE TO RELATED APPLICATIONS

This application is based on Japanese Patent Application 2009-224953 filed on Sep. 29, 2009. This application claims the benefit of priority from the Japanese Patent Application, so that the descriptions of which are all incorporated herein by reference.

FIELD OF THE INVENTION

The present invention relates to voltage monitors for batteries, and more particularly to such voltage monitors with a self diagnosis function thereof.

BACKGROUND OF THE INVENTION

Battery controllers are designed to compare the voltage of a battery with a threshold voltage to thereby prevent overcharging or overdischarging of the battery. One type of these battery controllers is installed with a fault diagnosis function of monitoring a spontaneous change in the threshold voltage due to, for example, the deterioration of electric elements with time; these electric elements configure a voltage source of the threshold voltage. One example of this type of these battery controllers is disclosed in Japanese Patent Application Publication No. 2003-92840.

The fault diagnosis function of the battery controller disclosed in the Patent Publication forcibly switches the threshold voltage relative to a specific value of the voltage of a battery by only a preset level to the higher side or the lower side, and compares the specific value of the battery voltage with the switched threshold voltage.

When the magnitude relation between the specific value of the battery voltage and the forcibly switched threshold voltage is not inversely related to that between the specific value of the battery voltage and the threshold voltage, the fault diagnosis function determines that there is a great spontaneous change in the threshold voltage. This detects the occurrence of the characteristic deviation of the threshold voltage from its original value.

SUMMARY OF THE INVENTION

The inventors have discovered that there is a point that should be improved in these battery controllers equipped with the fault diagnosis function.

Specifically, even if a spontaneous change arises in the threshold voltage so that the threshold voltage is deviated from its original value, a fault arising in the fault diagnosis function may cause the magnitude relation between the specific value of the battery voltage and the forcibly switched threshold voltage to be inversely related to that between the specific value of the battery voltage and the threshold voltage. This may miss the characteristic deviation of the threshold voltage from its original value.

In view of the circumstances set forth above, the present invention seeks to provide voltage monitors designed to address the point that should be improved in the battery controllers set forth above.

Specifically, the present invention aims at providing voltage monitors designed to further improve the reliability of detecting the characteristic deviation of a threshold voltage from its original value; this threshold voltage is used for preventing overcharging or overdischarging of a battery.

According to one aspect of the present invention, there is provided a voltage monitor for monitoring a voltage of a battery relative to a monitor threshold and for diagnosing the monitor threshold based on each of a first diagnostic threshold and a second diagnostic threshold. The voltage monitor includes a first obtaining unit configured to obtain a first relative relationship between the battery voltage and one of the monitor threshold and the first diagnostic threshold and to output first information indicative of the first relative relationship. The voltage monitor includes a second obtaining unit configured to obtain a second relative relationship between the battery voltage and one of the monitor threshold and the second diagnostic threshold and to output second information indicative of the second relative relationship. The voltage monitor includes a threshold switching unit configured to stepwisely switch a level of each of the first and second diagnostic thresholds to be used by a corresponding one of the first and second obtaining units by a constant level. The voltage monitor includes a first forced-output unit configured to forcibly output a first forced signal when a preset period of time has elapsed since a start of the stepwise switch of the first diagnostic threshold by the threshold switching unit. The voltage monitor includes a second forced-output unit configured to forcibly output a second forced signal when the preset period of time has elapsed since a start of the stepwise switch of the second diagnostic threshold by the threshold switching unit. The voltage monitor includes an abnormality detecting unit configured to:

receive the first information outputted from the first obtaining unit and the second information outputted from the second obtaining unit;

determine that an abnormality that affects on at least one of the first and second diagnostic thresholds arises in the voltage monitor when the first information is different from the second information;

receive the first forced signal outputted from the first forced-output unit and the second forced signal outputted from the second forced-output unit; and determine whether a timing at which the level of the first diagnostic threshold is switched for each step is deviated from a timing at which the level of the second diagnostic threshold is switched for a corresponding step based on a result of a comparison between the first forced signal and the second forced signal.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Figure 1:
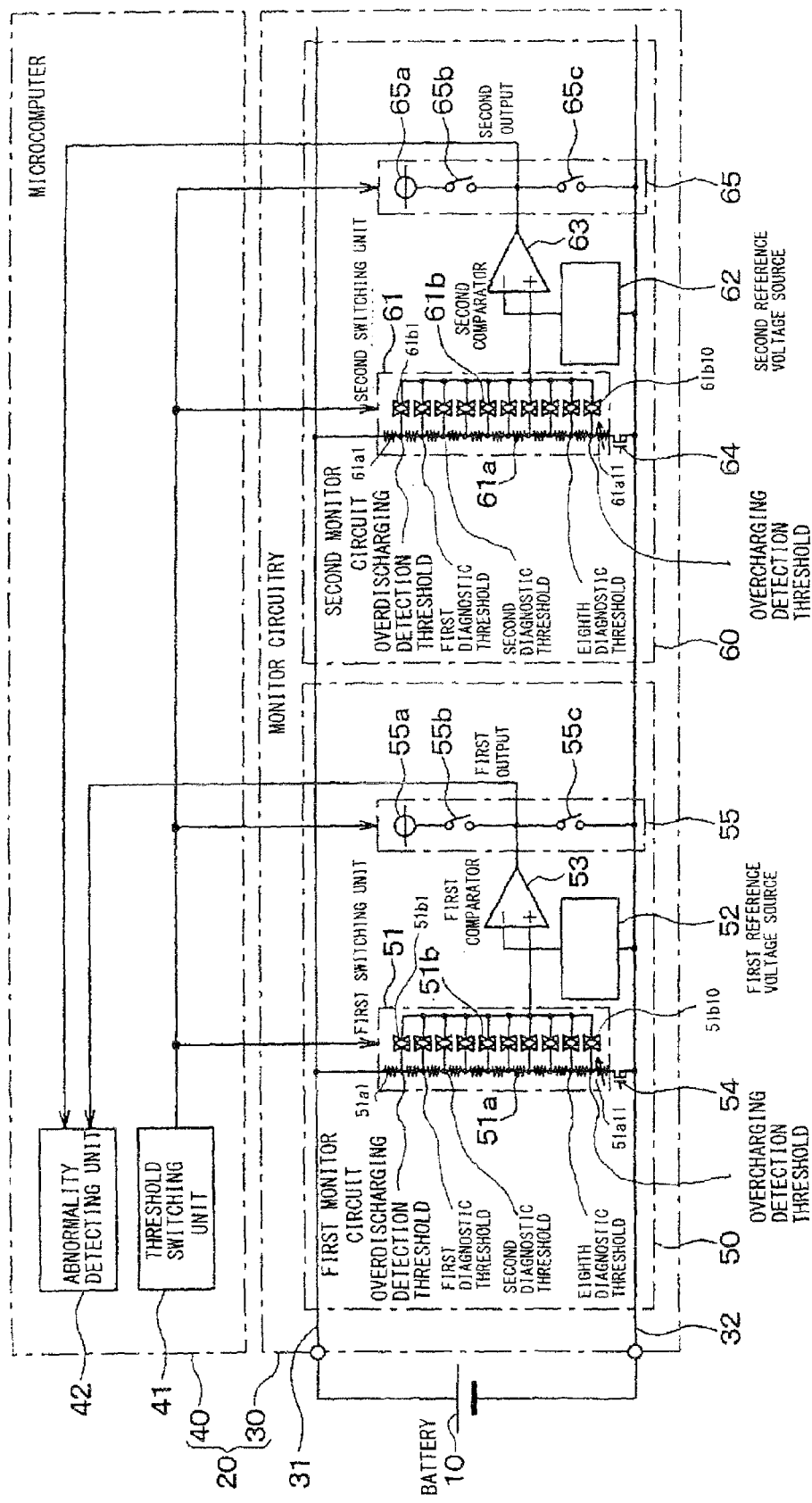
FIG. 1 is a circuit diagram of a voltage monitoring system incorporating a voltage monitor according to the first embodiment of the present invention.

Embodiments of the present invention will be described hereinafter with reference to the accompanying drawings. In the drawings, identical reference characters are utilized to identify identical corresponding components.

First Embodiment

A voltage monitoring system incorporating a voltage monitor 20 according to the first embodiment of the present invention is illustrated in FIG. 1. Referring to FIG. 1, the voltage monitoring system includes a battery 10 and the voltage monitor 20.

The battery 10 is a voltage source that can generate a constant voltage. The battery 10 is used to power driving loads and/or electronic components (not shown). For example, a primary battery (non-rechargeable battery) or a secondary battery (rechargeable battery) can be used as the battery 10. In this embodiment, a lithium-ion secondary battery is used as the battery 10 so that the battery 10 is chargeable by, for example, power generator (not shown).

The voltage monitor 20 has an overcharging/overdischarging detecting function of detecting overcharging and overdischarging of the secondary battery 10, and a self diagnosis function of diagnosing whether abnormalities arise in a section of the voltage monitor 20; this section implements the overcharging/overdischarging detecting function. The section of the voltage monitor 20 will be referred to as an "overcharging/overdischarging detecting section" hereinafter.

The overcharging/overdischarging detecting function is designed to compare the voltage of the battery 10 with a preset value to thereby monitor the voltage of the battery 10 (battery voltage). In this embodiment, the overcharging/overdischarging detecting function monitors the battery voltage to be within a range from a predetermined overcharging-detection threshold to a predetermined overdischarging-detection threshold.

The self diagnosis function is designed to detect whether at least one of the overcharging-detection threshold and the overdischarging-detection threshold has changed from any cause, such as abnormalities in the voltage monitor 20. Specifically, the self diagnosis function is designed to use a plurality of diagnostic thresholds for diagnosing whether abnormalities, such as faults or disturbances, arise in the overcharging/overdischarging detecting section of the voltage monitor 20.

The voltage monitor 20 includes a monitor circuitry 30 and a microcomputer 40.

The monitor circuitry 30 includes a first monitor circuit 50 and a second monitor circuit 60; these first and second monitor circuits 50 and 60 provide a dual monitor circuit. Specifically, the first and second monitor circuits 50 and 60 have an identical configuration. The monitor circuitry 30 is comprised of, for example, at least one IC (Integrated Circuit).

The first monitor circuit 50 is designed to compare the battery voltage with thresholds, and to output a result of the comparison.

Specifically, the first monitor circuit 50 is made up of a first switching unit 51, a first reference voltage source 52, a first comparator 53, a transistor 54, and a first forced-output unit 55.

The first switching unit 51 is electrically connected between a first line 31 electrically connected with a positive terminal of the battery 10 and a second line 32 electrically connected with a negative terminal of the battery 10. The first switching unit 51 is operative to generate, from the battery voltage, a plurality of threshold voltage levels corresponding to the overcharging-detection threshold, the overdischarging-detection threshold, and the plurality of diagnostic thresholds, respectively.

Specifically, in order to generate the plurality of threshold voltage levels, the first switching unit 51 is equipped with a plurality of resistors 51$a$ and a plurality of switches 51$b$; these resistors 51$a$ and switches 51$b$ provide a voltage divider.

Each of the plurality of switches 51$b$1 to 51$b$10 is comprised of, for example, a resistor and/or a transistor, and has an input terminal and an output terminal. Each of the plurality of switches 51$b$1 to 51$b$10 is controllable to be turned on and off to enable and disable current to flow between the input terminal and the output terminal. The number of plurality of switches 51$b$ is determined to be one less than the number of plurality of resistors 51$a$.

The resistors 51$a$ are connected in series between the first and second lines 31 and 32. Between each adjacent pair of resistors 51$a$ is a connection point. A switch 51$b$ is connected at its input terminal with each connection point so that the plurality of switches 51$b$ are parallel to each other.

For example, in this embodiment, eleven resistors 51$a$1 to 51$a$11 are used as the plurality of resistors 51$a$, and ten switches 51$b$1 to 51$b$10 are used as the plurality of switches 51$b$. The first resistor 51$a$1 is located closest to the first line 31, and the eleventh resistor 51$a$11 is located closest to the second line 32.

The output terminals of the switches 51$b$1 to 51$b$10 are commonly connected to a non-inverting input terminal (+ terminal) of the first comparator 53.

The eleventh resistor 51$a$ located closest to the second line 32 is a variable resistor for detecting overcharging of the battery 10, and the first switch 51$b$1 located closest to the first line 31 is a switch for detecting overdischarging of the battery 10.

When any one of the switches 51$b$1 to 51$b$10 is turned on, the battery voltage is divided among the resistors 51$a$1 to 51$a$11 in a ratio of their resistances; this ratio (ratio of voltage division) is determined by the position of a connection point corresponding to the turned-on switch. The divided voltage is inputted to the non-inverting input terminal of the first comparator 53 as a threshold voltage level.

For example, when the first switch 51$b$1 is turned on, the battery voltage is divided among the resistors 51$a$1 to 51$a$11 in the ratio of the resistance of the first resistor 51$a$1 to the sum of the resistances of the remaining resistors 51$a$2 to 51$a$11. The divided voltage is inputted to the non-inverting input terminal of the first comparator 53 as the overcharging-detection threshold, that is, as a threshold voltage level. Because the number of connection points is ten, the first switching circuit (voltage divider) 51 is capable of generating ten threshold voltage levels corresponding to the overdischarging-detection threshold, the first to eighth diagnostic thresholds as the plurality of diagnostic thresholds, and the overcharging-detection threshold.

Selectively turning on one of the switches $51b1$ to $51b10$ allows a divided voltage to be outputted to the first comparator 53 as one of the ten threshold voltage levels corresponding to the overdischarging-detection threshold, the first to eighth diagnostic thresholds, and the overcharging-detection threshold.

The overdischarging-detection threshold, the first to eighth diagnostic thresholds, and the overcharging-detection threshold are set within a usable voltage range of the battery 10. Because a lithium-ion secondary battery is used as the battery 10 in this embodiment, the overdischarging-detection threshold is set to, for example, 4.25 V, and the overcharging-detection threshold is set to, for example, 1.75 V. Thus, the first to eighth diagnostic thresholds are set within the usable voltage range of the battery 10 between 1.75 V and 4.25 V. The first to eighth diagnostic thresholds are set to be reduced stepwise in the order from the first diagnostic threshold to the eighth diagnostic threshold. That is, in this embodiment, the previous setting of the first to eighth diagnostic thresholds within the usable range of the battery 10 eliminates the need for stepwisely switching a diagnostic threshold within a total range of the battery 10 from its lower limit to its upper limit.

The first to eighth diagnostic thresholds are used for the voltage monitor 20 to carry out the self diagnosis function of detecting whether each threshold is deviated from its original value. The first to eighth diagnostic thresholds are reduced stepwisely by a constant voltage value in the order from the first diagnostic threshold to the eighth diagnostic threshold. For example, the first to eighth diagnostic thresholds are reduced stepwisely by 0.1 V in the order from the first diagnostic threshold to the eighth diagnostic threshold. This setting allows the difference between each adjacent pair of diagnostic thresholds to become 0.1 V.

In other words, the resistances of the first to eleventh resistors $51a1$ to $51a11$ are determined such that the first to eighth diagnostic thresholds are reduced stepwisely by a constant voltage value in the order from the first diagnostic threshold to the eighth diagnostic threshold. For example, for self diagnosis of the overcharging/overdischarging detecting section, the threshold voltage level to be outputted from the first switching unit 51 can be switched stepwisely from the highest first diagnostic threshold to the lowest eighth diagnostic threshold.

The first reference voltage source 52 is a power source for generating a constant first reference voltage level. The first reference voltage source 52 is electrically connected between the inverting input terminal (− terminal) of the first comparator 53 and the second line 32.

The first comparator 53 has the non-inverting input terminal, the inverting input terminal, and an output terminal. When a threshold voltage level is inputted to the non-inverting input terminal from the first switching unit 51 and the first reference voltage level is inputted to the inverting input terminal from the first reference voltage source 52, the first comparator 53 is adapted to output, as a first output, a result of the comparison between the threshold voltage level and the first reference voltage level.

Specifically, if the threshold voltage level is higher than the first reference voltage level, the first comparator 53 outputs, as the first output, a signal with a preset high level from its output terminal. Otherwise, if the threshold voltage level is lower than the first reference voltage level, the first comparator 53 outputs, as the first output, a signal with a preset low level from its output terminal.

The first forced-output unit 55 is operative to output a first forced signal after a preset first constant time has elapsed since the start of stepwise switching from the first diagnostic threshold to the eighth diagnostic threshold. The "first constant time" is a time required for switching of the first diagnostic threshold to a given diagnostic threshold. For example, the first constant time is set as a time required for switching of the first diagnostic threshold to the fifth diagnostic threshold or a time required for switching of the first diagnostic threshold to the eighth diagnostic threshold. Thus, the first forced signal includes timing information indicative of the lapse of the first constant time since the start of stepwise switching from the first diagnostic threshold to the eighth diagnostic threshold.

For example, the first forced-output unit 55 is made up of a voltage source $55a$, a switch $55b$, and a switch $55c$. One terminal of the switch $55b$ is electrically connected with the voltage source $55a$, and the other terminal thereof is electrically connected with the output terminal of the first comparator 53. One terminal of the switch $55c$ is electrically connected with the output terminal of the first comparator 53, and the other terminal of the switch $55c$ is electrically connected with the second line 32. The voltage source $55a$ is operative to generate a constant voltage. Each of the switches $55b$ and $55c$ is controllable to be turned on and off, and is comprised of, for example, a resistor and/or a transistor.

With the configuration of the first forced-output unit 55, when the switch $55b$ is turned on with the switch $55c$ being in off state, the potential of the output terminal of the first comparator 53 is fixed to the constant voltage of the voltage source $55a$. This forces the first output to be a signal with the high level. In contrast, when the switch $55c$ is turned on with the switch $55b$ being in off state, the potential of the output terminal of the first comparator 53 is fixed to the potential identical to the potential at the second line 32 corresponding to the potential at the negative terminal of the battery 10. This forces the first output to be a signal with the low level.

That is, the first forced signal is a signal forcibly generated by the switching operation of the switches $55b$ and $55c$.

Note that, when the monitored result of the battery voltage or the result of comparison between each of the first to eighth diagnostic thresholds and the reference voltage level is outputted from the first comparator 53, the switches $55b$ and $55c$ are kept off.

The transistor 54 is electrically connected between the eleventh resistor $51a11$ and the second line 32, and controllable to be turned on and off. The transistor 54 serves as a dark current interrupting means for interrupting dark current to the resistors $51a1$ to $51a11$ connecting between the first and second lines 31 and 32 when the battery 10 is not used. Specifically, while the battery 10 is not used, the transistor 54 is controlled to be in off state so that no dark current flows through the resistors $51a1$ to $51a11$. This prevents power consumption of the battery 10 due to dark current while the battery 10 is not used.

The second monitor circuit 60 together with the first monitor circuit 50 provides the dual monitor circuit. The second monitor circuit 60 has the same configuration as the first monitor circuit 50.

Specifically, the second monitor circuit 60 is designed to compare the battery voltage with a reference voltage, and to output a result of the comparison.

The second monitor circuit 60 is made up of a second switching unit 61, a second reference voltage source 62, a second comparator 63, a transistor 64, and a second forced output unit 65.

The second switching unit 61 is electrically connected between the first line 31 and the second line 32. As well as the first switching unit 51, the second switching unit 61 is operative to generate, from the battery voltage, a plurality of threshold voltage levels corresponding to the overcharging-detection threshold, the overdischarging-detection threshold, and the plurality of diagnostic thresholds, respectively.

The second switching unit 61 has the same configuration as the first switching unit 51. Specifically, the second switching unit 61 is equipped with a plurality of resistors 61a and a plurality of switches 61b; these resistors 61a and switches 61b provide a voltage divider.

As well as the first switching unit 51, the resistors 61a are connected in series between the first and second lines 31 and 32. Between each adjacent pair of resistors 61a is a connection point. A switch 61b is connected at its input terminal with each connection point so that the plurality of switches 61b are parallel to each other.

For example, in this embodiment, eleven resistors 61a1 to 61a11 are used as the plurality of resistors 61a, and ten switches 61b1 to 61b10 are used as the plurality of switches 61b.

The output terminals of the switches 61b1 to 61b10 are commonly connected to a non-inverting input terminal (+ terminal) of the second comparator 63. The configuration of the switches 61b1 to 61b10 is identical to that of the switches 51b1 to 51b10.

The overdischarging-detection threshold, the first to eighth diagnostic thresholds, and the overcharging-detection threshold to be generated by the second switching unit 61 are set to be in agreement with the overdischarging-detection threshold, the first to eighth diagnostic thresholds, and the overcharging-detection threshold to be generated by the first switching unit 51, respectively.

Selectively turning on one of the switches 61b1 to 61b10 allows, to the second comparator 63, a divided voltage as one of the ten threshold voltage levels corresponding to the overdischarging-detection threshold, the first to eighth diagnostic thresholds, and the overcharging-detection threshold to be outputted.

Like the first reference voltage source 52, the second reference voltage source 62 is a power source for generating a constant second reference voltage level that is the same as the first reference voltage to be generated by the first reference voltage source 52. The second reference voltage source 62 is electrically connected between the inverting input terminal (− terminal) of the second comparator 63 and the second line 32.

The second comparator 63 has the non-inverting input terminal, the inverting input terminal, and an output terminal. When a threshold voltage level is inputted to the non-inverting input terminal from the second switching unit 61 and the second reference voltage level is inputted to the inverting input terminal from the second reference voltage source 62, the second comparator 63 is adapted to output, as a second output, a result of the comparison between the threshold voltage level and the second reference voltage level.

Specifically, if the threshold voltage level is higher than the second reference voltage level, the second comparator 63 outputs, as the second output, a signal with the high level from its output terminal. Otherwise, if the threshold voltage level is lower than the second reference voltage level, the second comparator 63 outputs, as the second output, a signal with the low level from its output terminal.

The second forced-output unit 65 is operative to output a second forced signal after a preset second constant time has elapsed since the start of stepwise switching from the first diagnostic threshold to the eighth diagnostic threshold. The second constant time is set to be identical to the first constant time, and therefore, the second forced signal includes timing information indicative of the lapse of the second constant time since the start of stepwise switching from the first diagnostic threshold to the eighth diagnostic threshold.

The second forced-output unit 65 has the same configuration as the first forced-output unit 55. Specifically, the second forced-output unit 65 is made up of a voltage source 65a, a switch 65b, and a switch 65c. One terminal of the switch 65b is electrically connected with the voltage source 65a, and the other terminal thereof is electrically connected with the output terminal of the second comparator 63. One terminal of the switch 65c is electrically connected with the output terminal of the second comparator 63, and the other terminal of the switch 65c is electrically connected with the second line 32. The voltage source 65a is operative to generate a constant voltage like the voltage source 55a. Each of the switches 65b and 65c is controllable to be turned on and off, and is comprised of for example, a resistor and/or a transistor.

With the configuration of the second forced-output unit 65, when the switch 65b is turned on with the switch 65c being in off state, the potential of the output terminal of the second comparator 63 is fixed to the constant voltage of the voltage source 65a. This forces the second output to be a signal with the high level. In contrast, when the switch 65c is turned on with the switch 65b being in off state, the potential of the output terminal of the second comparator 63 is fixed to the potential identical to the potential at the second line 32 corresponding to the potential at the negative terminal of the battery 10. This forces the second output to be a signal with the low level.

That is, the second forced signal is a signal forcibly generated by the switching operation of the switches 65b and 65c.

Note that, when the monitored result of the battery voltage or the result of comparison between each of the first to eighth diagnostic thresholds and the reference voltage level is outputted from the second comparator 63, the switches 65b and 65c are kept off.

In this embodiment, each of first and second forced-output units 55 and 65 is configured to output a corresponding one of the first forced signal with the low level and the second forced signal with the low level, and after the lapse of a preset period of time, output a corresponding one of the first forced signal with the high level and the second forced signal with the high level. That is, each of the first and second forced signals always takes a predetermined logical level of high or low.

The transistor 64 is electrically connected between the eleventh resistor 61a11 and the second line 32, and controllable to be turned on and off. Like the transistor 54, the transistor 64 serves as a dark current interrupting means for interrupting dark current to the resistors 61a1 to 61a11 connecting between the first and second lines 31 and 32 when the battery 10 is not used.

As described above, each of the first monitor circuit 50 and the second monitor circuit 60 has the identical configuration set forth above. That is, the monitor circuitry 30 is comprised of the dual monitor circuit based on the first and second monitor circuits 50 and 60.

The microcomputer 40 is comprised of, for example, a clock, a CPU, an IO (Input and output) interface, a storage medium including a ROM (Read Only Memory), an EEPROM (Electrically Erasable and Programmable ROM), and a RAM (Random Access Memory), and so on.

The clock is configured to generate a series of periodic pulses known as a "clock signal".

The CPU is designed to execute, at the rate (frequency) of the clock signal, each instruction described in at least one program stored in the storage medium.

For example, the CPU is designed to execute, in accordance with the at least one program, an overcharging/overdischarging monitoring task and a self diagnostic task. That is, the CPU is operative to monitor, in accordance with the at least one program, whether overcharging/overdischarging of the battery 10 arises and determine whether at least one of the overcharging-detection threshold and the overdischarging-detection threshold spontaneously changes.

Specifically, in order to implement the check of overcharging/overdischarging of the battery 10 and the diagnosis of whether the overdischarging-detection threshold or the overcharging-detection threshold spontaneously changes, the microcomputer 40 functionally includes a threshold switching unit 41 and an abnormality detecting unit 42. These functions 41 and 42 can be implemented by hardware circuits or a combination of computer-implemented programs and hardware circuits.

The microcomputer 40 is electrically connected, via its IO Interface, with: each of the switches 51$b$1 to 51$b$10 of the first switching unit 51, the output terminal of the first comparator 53, each of the switches 55$b$ and 55$c$ of the first forced-output unit 55, each of the switches 61$b$1 to 61$b$10 of the second switching unit 61, the output terminal of the second comparator 63, and each of the switches 65$b$ and 65$c$ of the second forced-output unit 65.

The threshold switching unit 41 is operative to output instructions to the first switching unit 51 and the second switching unit 61 to thereby turn at least one of the switches 51$b$1 to 51$b$10 on or off, and turn at least one of the switches 61$b$1 to 61$b$10 on or off. Specifically, the threshold switching unit 41 is operative to determine the ratio of the resistances of the resistors 51$a$1 to 51$a$11 and the ratio of the resistances of the resistors 61$a$1 to 61$a$11.

Note that the ratio of the resistances of the resistors 51$a$1 to 51$a$11 represents the ratio of at least one of the resistors 51$a$1 to 51$a$11 on the first line side to the remaining resistor(s) on the second line side. For example, a voltage corresponding to the overdischarging-detection threshold is obtained by dividing the battery voltage in the ratio of the resistance of the first resistor 51$a$1 to the sum of the resistances of the remaining resistors 51$a$2 to 51$a$11. Determination of the ratio of the resistances of the resistors 51$a$1 to 51$a$11 in order to generate the divided voltage corresponding to the overdischarging-detection threshold causes the first switch 51$b$1 connected with the connection point between the resistors 51$a$1 and 51$a$2 to be only turned on with the remaining switches 51$b$2 to 51$b$11 being kept off. The ratio of the resistances of the resistors 61$a$1 to 61$a$11 represents the ratio of at least one of the resistors 61$a$1 to 61$a$11 on the first line side to the remaining resistor(s) on the second line side as well as the ratio of the resistances of the resistors 51$a$1 to 51$a$11.

Specifically, for monitor of overdischarging of the battery 10, the threshold switching unit 41 outputs, to the first switching unit 51 and the second switching unit 61, instructions for outputting the threshold voltage level corresponding to the overdischarging-detection threshold. These instructions allow the switches 51$b$1 and 61$b$1 to be only turned on with the remaining switches 51$b$2 to 51$b$10 and 61$b$2 and 61$b$10 being kept off so that the threshold voltage level corresponding to the overdischarging-detection threshold is outputted from each of the first switching unit 51 and the second switching unit 61.

Similarly, for monitor of overcharging of the battery 10, the threshold switching unit 41 outputs, to the first switching unit 51 and the second switching unit 61, instructions for outputting the threshold voltage level corresponding to the overcharging-detection threshold. These instructions allow the switches 51$b$10 and 61$b$10 to be only turned on with the remaining switches 51$b$1 to 51$b$9 and 61$b$1 and 61$b$9 being kept off so that the threshold voltage level corresponding to the overcharging-detection threshold is outputted from each of the first switching unit 51 and the second switching unit 61.

The threshold voltage level corresponding to the overdischarging-detection threshold, which has been outputted from each of the first and second switching units 51 and 61, is inputted to the non-inverting input terminal of a corresponding one of the first and second comparators 53 and 63. The result of the comparison between the threshold voltage level corresponding to the overdischarging-detection threshold and each of the first and second reference voltage levels is outputted, to the microcomputer 40, as a corresponding one of the first output and the second output from a corresponding one of the first and second comparators 53 and 63. When the first output and the second output are inputted to the microcomputer 40, the microcomputer 40 is programmed to determine whether overdischarging arises in the battery 10 based on the first output and second output.

Similarly, the threshold voltage level corresponding to the overcharging-detection threshold, which is outputted from each of the first and second switching units 51 and 61, is inputted to the non-inverting input terminal of a corresponding one of the first and second comparators 53 and 63. This results in that the result of the comparison between the threshold voltage level corresponding to the overcharging-detection threshold and each of the first and second reference voltage levels is outputted, to the microcomputer 40, as a corresponding one of the first output and the second output from a corresponding one of the first and second comparators 53 and 63. When the first output and the second output are inputted to the microcomputer 40, the microcomputer 40 is programmed to determine whether overcharging arises in the battery 10 based on the first output and second output.

For self diagnosis of the first monitor circuit 50, the threshold switching unit 41 outputs, to the first switching unit 51 at regular time intervals, instructions for stepwisely turning on the second switch 51$b$2 to the ninth switch 51$b$9 in the order from the second switch 51$b$2 to the ninth switch 51$b$9. This results in that the eight threshold voltage levels from the first diagnostic threshold to the eighth diagnostic threshold are stepwisely outputted at the regular time intervals in this order. In other words, a value of the threshold voltage level to be outputted from the first switching unit 51 is stepwisely changed.

Simultaneously with outputting the instructions to the first switching unit 51, for self diagnosis of the second monitor circuit 60, the threshold switching unit 41 outputs, to the second switching unit 61 at the regular time intervals, instructions for stepwisely turning on the second switch 61$b$2 to the ninth switch 61$b$9 in the order from the second switch 61$b$2 to the ninth switch 61$b$9. This results in that the eight threshold voltage levels from the first diagnostic threshold to the eighth diagnostic threshold are stepwisely outputted at the regular time intervals in this order. In other words, a value of the threshold voltage level to be outputted from the second switching unit 61 is stepwisely changed.

Specifically, for self diagnosis of the first monitor circuit 50, the first switching unit 41 switches, at preset timing, the overdischarging-detection threshold or the overcharging-detection threshold, which was set by the first switching unit 51 in a mode of the overdischarging/overcharging monitoring set forth above, to the first diagnostic threshold. Simultaneously with the switching, for self diagnosis of the second monitor circuit 60, the threshold switching unit 41 switches the overdischarging-detection threshold or the overcharging-detection threshold, which was set by the second switching unit 61 in the mode of the overcharging/overdischarging monitoring set forth above, to the first diagnostic threshold.

Thereafter, the threshold switching unit 41 switches the first diagnostic threshold set by each of the first and second switching unit 51 and 61 to the second diagnostic threshold after the lapse of a preset time, and thereafter, stepwisely switches the (n−1)-th diagnostic threshold previously set by each of the first and second switching units 51 and 61 to the n-th diagnostic threshold at the regular time intervals until the eighth diagnostic threshold is outputted.

In other words, each of the first and second switching units 51 and 61 is adapted to stepwisely change a corresponding one of the first reference voltage and the second reference voltage relative to the battery voltage being inputted to the non-inverting terminal of a corresponding one of the first and second comparators 53 and 63. Note that the preset timing is set to be, for example, synchronized with the rising or falling of one pulse of the clock signal, and therefore, the preset time and each of the regular time intervals correspond to one cycle of the clock signal.

After switching of the threshold voltage level to be outputted from each of the first and second switching units 51 and 61 to the eighth diagnostic threshold, the first switching unit 41 causes the first forced-output unit 55 to forcibly output the first forced signal, and the second forced-output unit 65 to forcibly output the second forced signal. Specifically, after the stepwise switch of the threshold voltage level to be outputted from each of the first and second switching units 51 and 61 from the first diagnostic threshold to the eighth diagnostic threshold, the first switching unit 41 turns the switches 55*c* and 65*c* on with the switches 55*b* and 65*b* being off, and, after the lapse of the preset period of time, such as the lapse of the one cycle of the clock signal, turns on the switches 55*b* and 65*b* and off the switches 55*c* and 65*c*.

The abnormality detecting unit 42 is operative to:

receive the first output of the first monitor circuit 50 as the result of the comparison between a threshold voltage level inputted to the first comparator 53 and the first reference voltage level;

receive the second output of the second monitor circuit 60 as the result of the comparison between a threshold voltage level inputted to the second comparator 63 and the second reference voltage level;

compare the first output with the second output; and determine that any abnormality arises in the overcharging/overdischarging detecting section of the voltage monitor 20 when the first output is different from the second output.

Note that the expression that any abnormality arises in the overcharging/overdischarging detecting section of the voltage monitor 20 means that any abnormality, such as a fault, arises in at least one of the first switching unit 51, the first reference voltage source 52, the first comparator 53, the second switching unit 61, the second reference voltage source 62, and the second comparator 63 so that at least one of a threshold voltage level inputted to the first comparator 53 and a threshold voltage level inputted to the second comparator 63 is abnormally changed.

Specifically, every stepwise switch of a threshold voltage level to be outputted from each of the first and second switching units 51 and 61, the abnormality detecting unit 42 receives the result of the comparison between a threshold voltage level inputted to the first comparator 53 and the first reference voltage level, and the result of the comparison between a threshold voltage level inputted to the second comparator 63 and the second reference voltage level. When the result of the comparison between a threshold voltage level inputted to the first comparator 53 and the first reference voltage level is different from that of the comparison between a threshold voltage level inputted to the second comparator 63 and the second reference voltage level, the abnormality detecting unit 42 detects that the threshold voltage level inputted to at least one of the first and second comparators 53 and 63 is abnormally changed. Because the output of each of the first and second switching units 51 and 61 is stepwisely switched from the first diagnostic threshold to the eighth diagnostic threshold, the abnormality detecting unit 42 compares the first output of the first comparator 53 with the second output of the second comparator 63 each time the output of each of the first and second switching units 51 and 61 is stepwisely switched.

On the other hand, when the first output is identical to the second output, the abnormality detecting unit 42 determines that no abnormalities arise in the overcharging/overdischarging detecting section of the voltage monitor 20.

As described above, the voltage monitor 20 according to this embodiment is designed to detect whether a threshold voltage level to be generated by the first monitor circuit 50 or the second monitor circuit 60 is abnormally changed by determining whether the first output is different from the second output each time the output of each of the first and second switching units 51 and 61 is stepwisely switched.

In addition, the abnormality detecting unit 42 is operative to:

compare the timing at which the first forced signal is inputted from the first forced-output unit 55 with the timing at which the second forced signal is inputted from the second forced-output unit 65; and determine that the timing at which the output of the first switching unit 51 is switched from a previous diagnostic threshold to a next diagnostic threshold is deviated from the timing at which the output of the second switching unit 61 is switched from a corresponding previous diagnostic threshold to a corresponding next diagnostic threshold.

As a result, the abnormality detecting unit 42 is capable of detecting a malfunction of at least one of the first and second monitor circuits 50 and 60. That is, the abnormality detecting unit 42 is capable of detecting that any abnormality arises in the self diagnostic function of the voltage monitor 20.

The overall structure of the voltage monitor 20 and the voltage monitoring system including the voltage monitor 20 have been described.

Next, monitoring operations of the voltage monitor 20, in other words, operations of the voltage monitor 20 for carrying out the overcharging/overdischarging monitoring task will be described hereinafter. The overcharging/overdischarging monitoring task is started when: the voltage monitor 20 is powered up, the voltage monitor 20 is powered down, or the voltage monitor 20 is externally instructed to start the overcharging/overdischarging monitoring task.

The overcharging/overdischarging monitoring task consists of an overcharging monitoring task and an overdischarging monitoring task.

Specifically, the voltage monitor 20 is designed to operate in one of the overcharging monitoring mode and the overdischarging monitoring mode each time one of these monitoring-task start conditions is met to thereby carry out a corresponding one of the overcharging monitoring task and the overdischarging monitoring task.

After completion of the corresponding one of the overcharging monitoring task and the overdischarging monitoring task, the voltage monitor 20 is designed to operate in the other of the overcharging monitoring mode and the overdischarging monitoring mode to thereby carry out the other of the overcharging monitoring task and the overdischarging monitoring task.

In this embodiment, the voltage monitor 20 is designed to operate in the overcharging monitoring mode each time one of these monitoring-task start conditions is met to thereby carry out the overcharging monitoring task, and after completion of the overcharging monitoring task, the voltage monitor 20 is designed to operate in the overdischarging monitoring mode to thereby carry out the overdischarging monitoring task.

Specifically, when the overcharging monitoring task is started in the overcharging monitoring mode, an instruction is inputted from the threshold switching unit 41 to each of the first switching unit 51 of the first monitor circuit 50 and the second switching unit 61 of the second monitor circuit 60 so that the switches 51b10 and 61b10 are only turned on with the remaining switches 51b1 to 51b9 and 61b1 and 61b9 being kept off. This results in that the threshold voltage level corresponding to the overcharging-detection threshold is outputted from each of the first switching unit 51 and the second switching unit 61.

The threshold voltage level corresponding to the overcharging-detection threshold is compared with the first threshold level by the first comparator 53, and is compared with the second threshold level by the second comparator 63. The result of the comparison between the threshold voltage level corresponding to the overcharging-detection threshold and each of the first and second reference voltage levels is outputted, to the microcomputer 40, as a corresponding one of the first output and the second output from a corresponding one of the first and second comparators 53 and 63.

Because each of the first and second reference voltage levels is constant, the relative comparison between the threshold voltage level corresponding to the divided voltage of the battery voltage and each of the first and second reference voltage levels substantially means a relative comparison between the battery voltage and each of the first and second reference voltage levels that is increased by the difference between the battery voltage and the threshold voltage level.

In the microcomputer 40, it is determined that overcharging arises in the battery 10 based on whether each of the first output and second output has the high level or the low level. When the SOC (State Of Charge) of the battery 10 is normal, the threshold voltage level corresponding to the overcharging-detection threshold (very low divided voltage), which follows the battery voltage, is lower than each of the first and second reference voltage levels so that the first and second outputs each with the low level are outputted from the first and second comparators 53 and 63. As a result, it is determined that overcharging does not arise in the battery 10.

In contrast, when the SOC of the battery 10 lies, for example, at its upper limit, the threshold voltage level corresponding to the overcharging-detection threshold, which follows the battery voltage, is higher than each of the first and second reference voltage levels so that the first and second outputs each with the high level are outputted from the first and second comparators 53 and 63. As a result, it is determined that overcharging arises in the battery 10.

After completion of the overcharging monitoring task, the overdischarging monitoring task is started in the overdischarging monitoring mode so that an instruction is inputted from the threshold switching unit 41 to each of the first switching unit 51 of the first monitor circuit 50 and the second switching unit 61 of the second monitor circuit 60. This allows the switches 51b1 and 61b1 to be only turned on with the remaining switches 51b2 to 51b10 and 61b2 and 61b10 being kept off. This results in that the threshold voltage level corresponding to the overdischarging-detection threshold is outputted from each of the first switching unit 51 and the second switching unit 61.

The threshold voltage level corresponding to the overdischarging-detection threshold is compared with the first threshold level by the first comparator 53, and is compared with the second threshold level by the second comparator 63. The result of the comparison between the threshold voltage level corresponding to the overdischarging-detection threshold and each of the first and second reference voltage levels is outputted, to the microcomputer 40, as a corresponding one of the first output and the second output from a corresponding one of the first and second comparators 53 and 63.

In the microcomputer 40, it is determined that overdischarging arises in the battery 10 based on whether each of the first output and second output has the high level or the low level. When the SOC of the battery 10 is normal, the threshold voltage level corresponding to the overdischarging-detection threshold (very high divided voltage close to the battery voltage), which follows the battery voltage, is higher than each of the first and second reference voltage levels so that the first and second outputs each with the high level are outputted from the first and second comparators 53 and 63. As a result, it is determined that overdischarging does not arise in the battery 10.

In contrast, when the SOC of the battery 10 lies at, for example, its lower limit, the threshold voltage level corresponding to the overdischarging-detection threshold, which follows the battery voltage, is lower than each of the first and second reference voltage levels so that the first and second outputs each with the low level are outputted from the first and second comparators 53 and 63. As a result, it is determined that overdischarging arises in the battery 10.

Note that, in this embodiment, the overcharging/overdischarging monitoring task is carried out based on the first output of the first monitor circuit 50 and the second output of the second monitor circuit 60, but it can be carried out based on either the first output of the first monitor circuit 50 or the second output of the second monitor circuit 60.

Next, self-diagnostic operations of the voltage monitor 20 in a self-diagnostic mode, in other words, operations of the voltage monitor 20 for carrying out the self-diagnostic task will be described hereinafter with reference to FIGS. 2 and 3. The self-diagnostic task is started, for example, after completion of the overcharging/overdischarging monitoring task.

Figure 2:
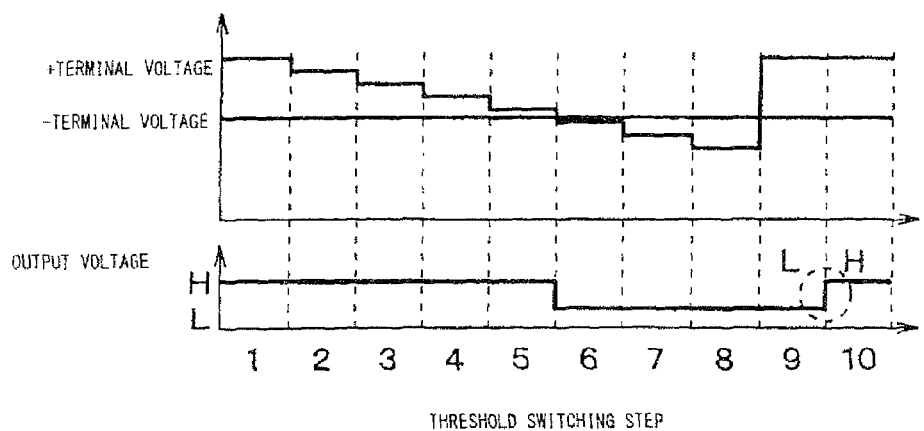
FIG. 2 is a timing chart schematically illustrating input and output timings to first and second comparators when threshold switch timing of the output of at least one of first and second switching units from a first diagnostic threshold to an eighth diagnostic threshold is not deviated from its normal timing according to the first embodiment.

FIG. 2 is a timing chart schematically illustrating input and output timings to the first and second comparators 53 and 63 when the threshold switch timing of the output of at least one of the first and second switching units 51 and 61 from the first diagnostic threshold to the eighth diagnostic threshold is not deviated from its normal timing. FIG. 3 is a timing chart schematically illustrating input and output timings to the first and second comparators 53 and 63 when the threshold switch timing of the output of at least one of the first and second switching units 51 and 61 from the first diagnostic threshold to the eighth diagnostic threshold is deviated from its normal timing.

When the self-diagnostic task is started in the self-diagnostic mode, a first instruction is inputted from the threshold switching unit 41 to each of the first switching unit 51 of the first monitor circuit 50 and the second switching unit 61 of the second monitor circuit 60 at the same timing. The first instruction instructs each of the first and second switching units 51 and 61 to output the threshold voltage level corresponding to the first diagnostic threshold.

The first instruction causes the switch $51b2$ to be turned on with the remaining switches $51b1$ and $51b3$ to $51b10$ being kept off so that the battery voltage is divided among the resistors $51a1$ to $51a11$ in the ratio of the resistance of the sum of the first and second resistors $51a1$ and $51a2$ to the sum of the resistances of the remaining resistors $51a3$ to $51a11$. This results in that the threshold voltage level corresponding to the first diagnostic threshold is outputted from the first switching unit 51.

Similarly, the first instruction causes the switch $61b2$ to be turned on with the remaining switches $61b1$ and $61b3$ to $61b10$ being kept off so that the battery voltage is divided among the resistors $61a1$ to $61a11$ in the ratio of the resistance of the sum of the first and second resistors $61a1$ and $61a2$ to the sum of the resistances of the remaining resistors $61a3$ to $61a11$. This results in that the threshold voltage level corresponding to the first diagnostic threshold is outputted from the second switching unit 61.

The threshold voltage level corresponding to the first diagnostic threshold is compared with the first reference voltage level by the first comparator 53, and the result of the comparison between the threshold voltage level corresponding to the first diagnostic threshold and the first reference voltage level is outputted, as the first output, to the microcomputer 40 from the first comparator 53. Similarly, the threshold voltage level corresponding to the first diagnostic threshold is compared with the second reference voltage level by the second comparator 63, and the result of the comparison between the threshold voltage level corresponding to the first diagnostic threshold and the second reference voltage level is outputted, as the second output, to the microcomputer 40 from the second comparator 63.

If the threshold voltage level corresponding to the first diagnostic threshold is higher than each of the first and second reference voltage levels, each of the first output and the second output has the high level. Otherwise, if the threshold voltage level corresponding to the first diagnostic threshold is lower than each of the first and second reference voltage levels, each of the first output and the second output has the low level.

The first output inputted to the abnormality detecting unit 42 from the first comparator 53 and the second output inputted thereto from the second comparator 63 are compared with each other by the abnormality detecting unit 42.

Thereafter, a second instruction is outputted from the threshold switching unit 41 so as to be inputted to each of the first switching unit 51 of the first monitor circuit 50 and the second switching unit 61 of the second monitor circuit 60 at the same timing. The second instruction instructs each of the first and second switching unit 51 and 61 to output the threshold voltage level corresponding to the second diagnostic threshold. Thus, in the same manner as the first instruction, the first output of the first comparator 53 and the second output of the second comparator 63 are inputted to the abnormality detecting unit 42 so that they are compared with each other by the abnormality detecting unit 42.

After output of the second instruction, third to eighth instructions are stepwise outputted from the threshold switching unit 41 so as to be inputted to each of the first switching unit 51 of the first monitor circuit 50 and the second switching unit 61 of the second monitor circuit 60.

That is, the first to eighth instructions to be stepwise inputted to each of the first switching unit 51 and the second switching unit 61 allow the battery voltage to be stepwisely divided in their corresponding ratios defined by the respective first to eighth instructions. In other words, the output of each of the first and second switching units 51 and 61 is stepwisely switched from the first diagnostic threshold to the eighth diagnostic threshold so that the threshold voltage levels corresponding to the first to eighth diagnostic thresholds are stepwisely outputted.

After switch of the output of each of the first and second switching units 51 and 61 up to the eighth diagnostic threshold, an instruction is outputted from the threshold switching unit 41 to each of the first and second forced-output units 55 and 65; this instruction instructs each of the first and second forced-output units 55 and 65 to output a corresponding one of the first forced signal and the second forced signal.

In the first forced-output unit 55, the instruction causes the switch $55c$ to be turned on with the switch $55b$ being kept off so that a signal with the low level is forcibly generated, and, after the lapse of the preset period of time (for example, one clock cycle), causes the switch $55b$ to be turned on and the switch $55c$ to be turned off so that a signal with the high level is forcibly generated. The signal whose level is switched from the low level to the high level is outputted from the first monitor circuit 50 to the abnormality detecting unit 42 as the first forced signal.

Similarly, in the second forced-output unit 65, the instruction causes the switch $65c$ to be turned on with the switch $65b$ being kept off so that a signal with the low level is forcibly generated, and after the lapse of the preset period of time (for example, one clock cycle), causes the switch $65b$ to be turned on and the switch $65c$ to be turned off so that a signal with the high level is forcibly generated. The signal whose level is switched from the low level to the high level is outputted from the second monitor circuit 60 to the abnormality detecting unit 42 as the second forced signal.

Because each of the first and second forced signals is outputted from a corresponding one of the first and second monitor circuits 50 and 60 after completion of the stepwise switch by a corresponding one of the first and second switching units 51 and 61 from the first diagnostic threshold to the eighth diagnostic threshold, each of the first and second forced signals represents the completion of the switch of the threshold voltage level.

As described above, the voltage monitor 20 operates in the self-diagnostic mode so that the first to eighth diagnostic thresholds of each of the first and second switching units 51 and 61 are stepwisely switched and, thereafter, the first and second forced signals are outputted. At that time, if no threshold voltage levels in each of the first and second monitor circuits 50 and 60 are abnormally deviated from their normal voltage levels, and the threshold switch timing of the output of at least one of the first and second switching units 51 and 61 from the first diagnostic threshold to the eighth diagnostic threshold is not deviated from its normal timing, the input/output of each of the switching units 51 and 61 and the output of each of the first and second monitor circuits 50 and 60 are illustrated in FIG. 2.

The vertical axis of the upper timing chart illustrated in FIG. 2 represents the voltage at the inverting input terminal (− terminal voltage) of each of the first and second comparators 53 and 63, and the voltage at the non-inverting input terminal (+ terminal voltage) thereof. The vertical axis of the lower timing chart represents the voltage of each of the first output of the first comparator 53 and the second output of the second comparator 63. The horizontal axis of each of the upper and lower timing charts represents the steps in switch of threshold-voltage level. That is, in the horizontal axis of each of the upper and lower timing charts, "1" to "8" represent the first to eighth steps in which the first to eighth diagnostic thresholds are respectively outputted, and "9" represents the ninth step in which each of the first and second forced signals with the low level is outputted. "10" represents the tenth step in which each of the first and second forced signals with the high level is outputted.

As described above, the structure of the first switching unit 51 is identical to that of the second switching unit 61, and the first reference voltage to be generated by the first reference voltage source 52 is identical to the second reference voltage to be generated by the second voltage source 62. For these reasons, if no threshold voltage levels in each of the first and second monitor circuits 50 and 60 are abnormally deviated from their normal voltage levels, the threshold voltage level to be inputted to the first comparator 53 and the first reference voltage have the waveforms illustrated in the upper timing chart in FIG. 2; these waveforms are the same as the waveforms that the threshold voltage level to be inputted to the second comparator 63 and the second reference voltage have.

When the output of each of the first and second switching units 51 and 61 is stepwisely switched from the first diagnostic threshold to the fifth diagnostic threshold by the threshold switching unit 41, if, for example, the threshold voltage level corresponding to each of the first to fifth diagnostic thresholds is higher than each of the first and second reference voltage levels, the first output of the first comparator 53 and the second output of the second comparator 63 constantly have the high level.

When the output of each of the first and second switching units 51 and 61 is stepwisely switched from the fifth diagnostic threshold to the sixth diagnostic threshold by the threshold switching unit 41, the threshold voltage level corresponding to the sixth diagnostic threshold is reversed to be lower than each of the first and second reference voltage levels so that the first output of the first comparator 53 and the second output of the second comparator 63 have the low level. That is, the switch timing from the fifth diagnostic threshold to the sixth diagnostic threshold represents the reversal timing of the output of each of the first and second switching units 53 and 63 so that the result of the comparison by each of the first and second comparators 53 and 63 is switched from the voltage with the high level to the voltage with the low level.

As described above, if no threshold voltage levels in each of the first and second monitor circuits 50 and 60 are abnormally deviated from their normal voltage levels, the input and output of the first comparator 53 are completely identical to that of the second comparator 63 (see FIG. 2). Thus, the abnormality detecting unit 42 determines that the result of the comparison by the first monitor circuit 50 from the first to eighth diagnostic thresholds is identical to that of the comparison by the second monitor circuit 60 from the first to eighth diagnostic thresholds, and detects that no abnormalities arise in each of the first and second monitor circuits 50 and 60.

In addition, because there are no characteristic deviations between the threshold switch timing of the output of the first switching unit 51 from the first diagnostic threshold to the eighth diagnostic threshold and the threshold switch timing of the output of the first switching unit 51 from the first diagnostic threshold to the eighth diagnostic threshold, the waveform of the first forced signal to be outputted from the first monitor circuit 50 is identical to that of the second forced signal to be outputted from the second monitor circuit 60. That is, the rising timing of the first forced signal from the low level to the high level is identical to that of the second forced signal from the low level to the high level.

For this reason, the abnormality detecting unit 42 determines that the input timing of the first forced signal from the first monitor circuit 50 is identical to that of the second forced signal from the second monitor circuit 60. That is, the abnormality detecting unit 42 detects that there are no characteristic deviations between the threshold switch timing of the output of the first switching unit 51 from the first diagnostic threshold to the eighth diagnostic threshold and the threshold switch timing of the output of the first switching unit 51 from the first diagnostic threshold to the eighth diagnostic threshold.

Thus, it is possible to evidence that the result of determination by the abnormality detecting unit 42 that no abnormalities arise in each of the first and second monitor circuits 50 and 60 is correctly obtained with no abnormalities arising in the self-diagnostic function. That is, the determination by the abnormality detecting unit 42 that no abnormalities arise in each of the first and second monitor circuits 50 and 60 is proved to be correct.

Figure 3:
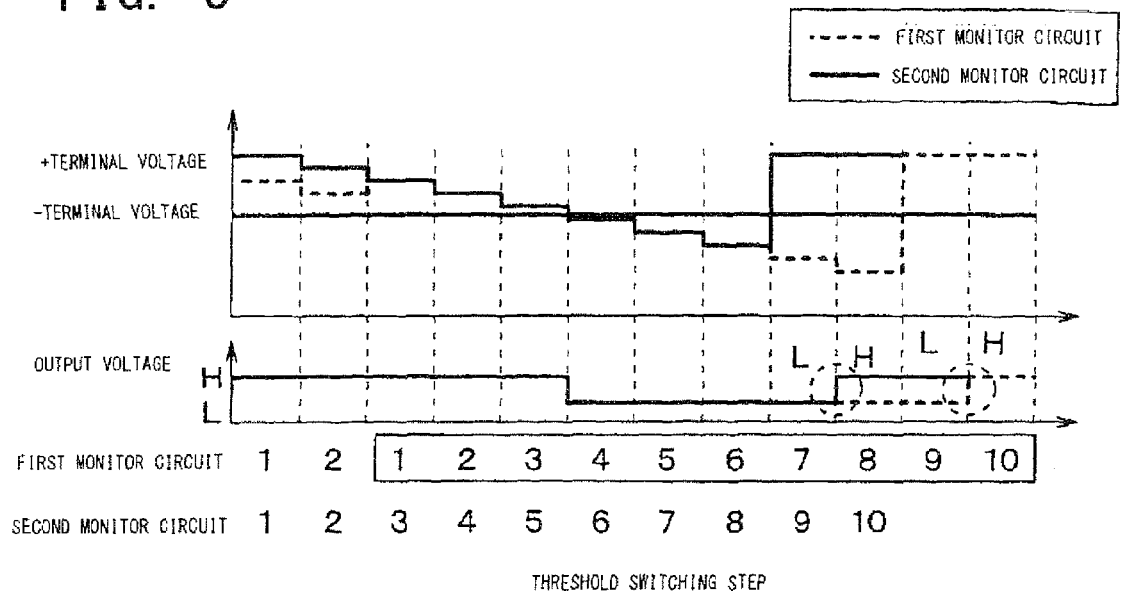
FIG. 3 is a timing chart schematically illustrating input and output timings to the first and second comparators when the threshold switch timing of the output of at least one of the first and second switching units from the first diagnostic threshold to the eighth diagnostic threshold is deviated from its normal timing.

Otherwise, if at least one threshold voltage level in at least one of the first and second monitor circuits 50 and 60 is abnormally deviated from its normal voltage level, and the switch timing from a previous diagnostic threshold to a next diagnostic threshold in the first monitor circuit 50 is deviated from the switch timing from a corresponding previous diagnostic threshold to a corresponding next diagnostic threshold in the second monitor circuit 60, the input/output of each of the switching units 51 and 61 and the output of each of the first and second monitor circuits 50 and 60 are illustrated in FIG. 3. The characteristic deviation of a threshold voltage level from its normal voltage level can arise due to, for example, the characteristic change of the first reference voltage 52 and/or the second reference voltage 62, the fluctuations in the resistance of at least one of the resistors 51a and 61a, and the like. The characteristic deviation of the threshold switch timing between the first and second monitor circuits 50 and 60 can arise due to noise from the exterior of them and the like.

Let us describe an example where at least one threshold voltage level in the first monitor circuit 50 is abnormally deviated from its normal voltage level, and the threshold switch timing of the output of the first switching unit 51 from the first diagnostic threshold to the eighth diagnostic threshold is deviated from its normal timing whereas no threshold-voltage deviations and no threshold switch timing deviations arise in the second monitor circuit 60.

In this example, let us assume that the characteristic deviation of at least one threshold voltage level in the first monitor circuit 50 is that the output of the first switching unit 51 is switched by a constant level from that of the second switching unit 61. Specifically, as illustrated in FIG. 3, the voltage (+ terminal voltage) at the non-inverting input terminal of the first comparator 53 is lower by a constant level than the voltage (+ terminal voltage) at the non-inverting input terminal of the second comparator 63.

In addition, let us assume that the characteristic deviation of the threshold switch timing caused in the first monitor circuit 50 arises at the timing at which the output of the first switching unit 51 should be switched from the second diagnostic threshold to the third diagnostic threshold so that, thereafter, the output of the first switching unit 51 is switched from the first diagnostic threshold to the eighth diagnostic threshold.

The vertical axes and the horizontal axis of the upper and lower timing charts in FIG. 3 are identical to those of the upper and lower timing charts in FIG. 2.

In this embodiment, as described above, no threshold voltage levels in the second monitor circuit 60 are abnormally deviated from their normal voltage levels. Thus, when the output of the second switching unit 61 is stepwisely switched from the first diagnostic threshold to the fifth diagnostic threshold by the threshold switching unit 41, if, for example, the threshold voltage level corresponding to each of the first to fifth diagnostic thresholds is higher than each of the first and second reference voltage levels, the first output of the first comparator 53 and the second output of the second comparator 63 constantly have the high level.

In contrast, the output of the first switching unit 51 is stepwisely switched from the first diagnostic threshold to the second diagnostic threshold by the threshold switching unit 41. However, the characteristic deviation of the threshold switch timing of the first monitor circuit 50 from its normal timing arises at the timing when the output of the first switching unit 51 should be switched from the second diagnostic threshold to the third diagnostic threshold. The characteristic deviation causes the first switching unit 51 to set the first diagnostic threshold again although the second switching unit 61 sets the third diagnostic threshold. For this reason, the switch of the output of the first switching unit 51 is delayed by two steps (two cycles of the clock signal) from its normal switch timing. In addition, because the output of the first switching unit 51 is set to the first diagnostic threshold, the threshold voltage level (the first diagnostic threshold) to be inputted to the non-inverting input terminal of the first comparator 53 is identical to the threshold voltage level (the third diagnostic threshold) to be inputted to the non-inverting input terminal of the second comparator 63.

Thereafter, the stepwise switch of the output of each of the first and second switching units 51 and 61 is continued by the threshold switching unit 41. As a result, in the normal second switching unit 61, the magnitude correlation between an outputted threshold voltage level and the second reference voltage level is reversed at the switch timing from the fifth diagnostic threshold to the sixth diagnostic threshold.

In contrast, in the first switching unit 51 with the threshold deviation and the switch-timing deviation, the magnitude correlation between an outputted threshold voltage level and the first reference voltage level is reversed at the switch timing from the third diagnostic threshold to the fourth diagnostic threshold. Thus, the first output of the first comparator 53 and the second output of the second comparator 63 are switched at the same timing from the high level to the low level.

Thereafter, because the switch of the output of the second switching unit 61 is earlier by two steps (two cycles of the clock signal) than the switch of the output of the first switching unit 51, the instruction is outputted from the threshold switching unit 41 to the second forced-output unit 65 at the step of switching the output of the first switching unit 51 from the sixth diagnostic threshold to the seventh diagnostic threshold; this instruction instructs the second forced-output unit 65 to output the second forced signal. This outputs, from the second monitor circuit 60 to the abnormality detecting unit 42, the second forced signal whose level is switched from the low level to the high level at the step of switching the output of the first switching unit 51 from the seventh diagnostic threshold to the eighth diagnostic threshold.

Thereafter, when the output of the first switching unit 51 is switched up to the eighth diagnostic threshold by the threshold switching unit 41, the instruction is outputted from the threshold switching unit 41 to the first forced-output unit 55; this instruction instructs the first forced-output unit 55 to output the first forced signal. This outputs, from the first monitor circuit 50 to the abnormality detecting unit 42, the first forced signal whose level is switched from the low level to the high level; this level switch is delayed from the level switch of the second forced signal by two steps (two cycles of the clock signal).

At that time, the abnormality detecting unit 42 determines that the first output of the first comparator 53 is identical to the second output of the second comparator 63 to thereby detect that no abnormalities arise in each of the first and second monitor circuits 50 and 60.

However, because the level switch timing (the rising timing) of the first forced signal is different from that of the second forced signal, the abnormality detecting unit 42 determines that the input timing of the first forced signal from the first monitor circuit 50 is different from that of the second forced signal from the second monitor circuit 60. Thus, the abnormality detecting unit 42 detects that there is a characteristic deviation between the threshold switch timing of the output of the first switching unit 51 from the first diagnostic threshold to the eighth diagnostic threshold and the threshold switch timing of the output of the first switching unit 51 from the first diagnostic threshold to the eighth diagnostic threshold.

That is, the abnormality detecting unit 42 detects any abnormality in the self-diagnostic function to thereby prove that the determination by the abnormality detecting unit 42 that no abnormalities arise in each of the first and second monitor circuits 50 and 60 is incorrect.

When the erroneous determination is proved, the threshold switching unit 41 can retry the self-diagnostic task by carrying out the stepwise switch of the output of each of the first and second switching units 51 and 61 again. The abnormality detecting unit 42 can externally alert, via the microcomputer 40, someone of any abnormality in the self-diagnostic function.

As described above, the voltage monitor 20 according to the first embodiment is provided with the first forced-output unit 55 and the second forced-output unit 65 in the first monitor circuit 50 and the second monitor circuit 60, respectively. The voltage monitor 20 is configured to stepwisely switch the output of each of the first and second switching units 51 and 61 from the first diagnostic threshold to the eighth diagnostic threshold, and to cause each of the first and second forced-output units 55 and 65 to output a corresponding one of the first and second forced signals after switch of the output of each of the first and second switching units 51 and 61 to the eighth diagnostic threshold.

This configuration enables the abnormality detecting unit 42, to which each of the first and second forced signals is inputted, to detect that the switch timing of the output of the first switching unit 51 is deviated from that of the output of the second switching unit 51 when the input timing of the first forded signal is different from that of the second forced signal. This allows the voltage monitor 20 to detect any abnormality in the self-diagnostic function (self-diagnostic section) installed therein.

Thus, the voltage monitor 20 prevents erroneous determination that no abnormalities arise in each of the first and second switching units 51 and 61 even if at least one threshold voltage level in at least one of the first and second monitor circuits 50 and 60 is abnormally deviated from its normal voltage level. In addition, because the voltage monitor 20 is adapted to detect the characteristic deviation of each of the overdischarging and overcharging thresholds from its original value, it prevents the battery 10 from being used with at least one of the overdischarging and overcharging thresholds being deviated from its original value, thus early prevent the battery 10 from being deteriorated.

Second Embodiment

A voltage monitoring system incorporating a voltage monitor according to the second embodiment of the present invention will be described hereinafter with reference to FIGS. 4 and 5.

The structure and/or functions of the voltage monitoring system according to the second embodiment are different from the voltage monitoring system according to the first embodiment by the following points. So, the different points will be mainly described hereinafter.

The voltage monitoring system according to the first embodiment provides the dual monitor circuit based on the first monitor circuit 50 and the second monitor circuit 60, and relatively compares the output of the first monitor circuit 50 with that of the second monitor circuit 60 to thereby detect the characteristic deviation of at least one threshold voltage level from its normal value and/or the characteristic deviation of the threshold switch timing from its normal timing in each of the first and second monitor circuits 50 and 60.

In contrast, the voltage monitoring system according to the second embodiment is configured to detect the characteristic deviation of at least one threshold voltage level from its normal value and/or the characteristic deviation of the threshold switch timing from its normal timing in one monitor circuit.

Figure 4:
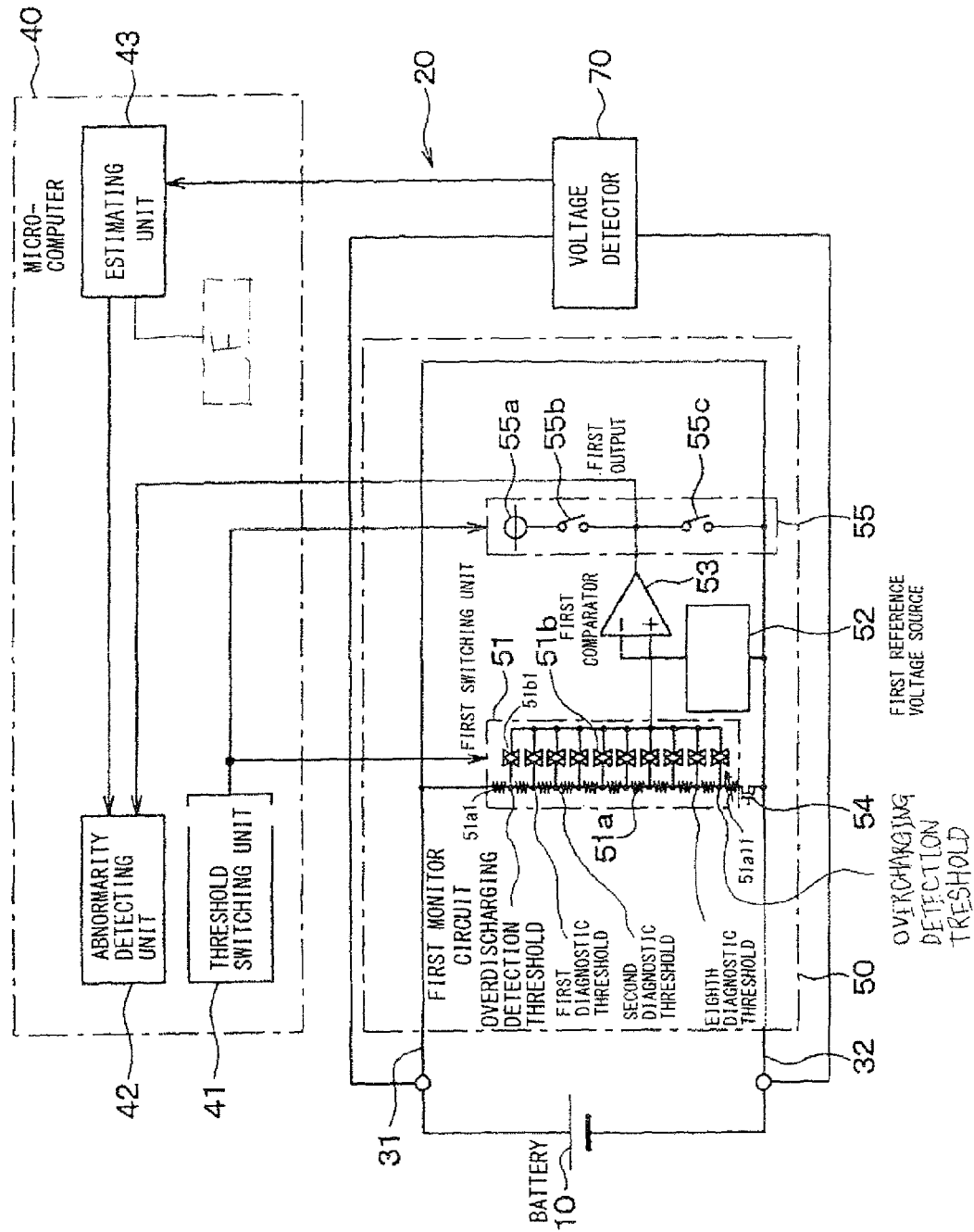
FIG. 4 is a circuit diagram of a voltage monitoring system incorporating a voltage monitor according to the second embodiment of the present invention.

Referring to FIG. 4, the voltage monitoring system includes the first monitor circuit 50, a voltage detector 70, and the microcomputer 40. The structure of the first monitor circuit 50 according to this embodiment is substantially the same as that of the first monitor circuit 50 according to the first embodiment.

The voltage detector 70 is adapted to detect the voltage of the battery 10. Specifically, the voltage detector 70 is electrically connected with each of the first line 31 and the second line 32 to allow input of a voltage at the first line 31 and a voltage at the second line 32 thereto. The voltage detector 70 is electrically connected with the microcomputer 40 and adapted to output, to the microcomputer 40, the battery voltage detected thereby.

The microcomputer 40 functionally includes, in addition to the threshold switching unit 41 and the abnormality detecting unit 42, an estimating unit 43. These functions 41 to 43 can be implemented by hardware circuits or a combination of computer-implemented programs and hardware circuits.

The estimating unit 43 is operative to receive the battery voltage detected by the voltage detector 70, and estimate, based on the detected battery voltage, the first output of the first monitor circuit 50, that is, the result of the comparison between a threshold voltage level to be inputted to the first comparator 53 and the first reference voltage.

Specifically, the microcomputer 40 stores in the storage medium information F representing the first diagnostic threshold to the eighth diagnostic threshold. When the output of the first switching unit 51 is stepwisely switched from the first diagnostic threshold to the eighth diagnostic threshold, the estimating unit 43 is operative to estimate, based on the information F, which switch timing the output of the first comparator 53 is reversed. The estimating unit 43 is operative to output the estimated result of the reverse timing of the output of the first comparator 53 to the abnormality detecting unit 42.

The estimating unit 43 is also operative to estimate, based on the estimated result of the reverse timing of the output of the first comparator 53, the timing at which the first forced signal outputted from the first forced-output unit 55 is reversed.

Specifically, because the estimated result of the reverse timing of the output of the first comparator 53 represents the timing at which the output of the first comparator 53 is reversed, the estimating unit 43 enables estimation of which timing the first forced signal is reversed from the low level to the high level after switch of the output of the first switching unit 51 to the eighth diagnostic threshold based on the result of the estimation. The estimating unit 43 is operative to output, to the abnormality detecting unit 42, the estimated reverse timing of the first forced signal.

The abnormality detecting unit 42 is operative to receive the estimated result of the reverse timing of the output of the first comparator 53 and the estimated reverse timing of the first forced signal, and determine, based on the estimated result of the reverse timing of the output of the first comparator 53 and the estimated reverse timing of the first forced signal, whether the characteristic deviation of at least one threshold voltage level from its normal value and/or the characteristic deviation of the threshold switch timing from its normal timing in the first monitor circuit 50 arises.

Next, operations of the voltage monitor 20 for detecting the characteristic deviations of at least one threshold voltage level from its normal voltage level and the characteristic deviations of the threshold switch timing from its normal timing will be described hereinafter with reference to FIG. 5. FIG. 5 is a timing chart schematically illustrating input and output timings to the first comparator 53 when the threshold switch timing of the output of the first switching unit 51 from the first diagnostic threshold to the eighth diagnostic threshold is deviated from its normal timing.

Note that operations of the voltage monitor 20 for detecting overcharging/overdischarging of the battery 20 according to the second embodiment are substantially identical to those of the voltage monitor 20 for detecting overcharging/overdischarging of the battery 20 according to the first embodiment, and therefore, the description of which are omitted.

When the self-diagnostic task is started in the self-diagnostic mode, the battery voltage is detected by the voltage detector 70, and the detected battery voltage is inputted to the estimating unit 43.

In the estimating unit 43, when the output of the first switching unit 51 is stepwisely switched from the first diagnostic threshold to the eighth diagnostic threshold, which switch timing the output of the first comparator 53 is reversed is estimated based on the detected battery voltage and the information F. That is, as illustrated in FIG. 5, if the threshold switch timing of the output of the first switching unit 51 from the first diagnostic threshold to the eighth diagnostic threshold is not deviated from its normal timing, the magnitude correlation between an outputted threshold voltage level (+ terminal voltage) to be inputted to the first comparator 53 and the first reference voltage level to be inputted thereto is estimated to be reversed at the switch timing from the fifth diagnostic threshold to the sixth diagnostic threshold. The estimated result of the level reversing timing is outputted from the estimating unit 43 to the abnormality detecting unit 42.

In the estimating unit 43, the timing at which the first forced signal is outputted from the first forced-output unit 55 is reversed from the low level to the high level is estimated based on the estimated result of the level reversing timing. The estimated result of the level switch timing is outputted from the estimating unit 43 to the abnormality detecting unit 42.

In the abnormality detecting unit 42, the level switch timing of the first forced signal is compared with the estimated result of the level switch timing so that it is determined whether at least one threshold voltage level outputted from the first switching unit 51 is deviated from its normal voltage level, and the level switch timing of the first forced signal is deviated from the estimated result of the level switch timing.

On the other hand, the first instruction is inputted from the threshold switching unit 41 to the first switching unit 51 of the first monitor circuit 50. The first instruction instructs the first switching unit 51 to output the threshold voltage level corresponding to the first diagnostic threshold. The first instruction causes the switch 51b2 to be turned on with the remaining switches 51b1 and 51b3 to 51b10 being kept off so that the battery voltage is divided among the resistors 51a1 to 51a11 in the ratio of the resistance of the sum of the first and second resistors 51a1 and 51a2 to the sum of the resistances of the remaining resistors 51a3 to 51a 11. This results in that the threshold voltage level corresponding to the first diagnostic threshold is outputted from the first switching unit 51.

Thereafter, the second to eighth instructions are stepwisely outputted from the threshold switching unit 41 to the first switching unit 51 of the first monitor circuit 50 so that the output of the first switching unit 51 is stepwisely switched from the second diagnostic threshold to the eighth diagnostic threshold. In the first comparator 53, each of the first to eighth diagnostic thresholds is compared with the first reference voltage so that the result of the comparison for each of the first to eighth diagnostic thresholds is outputted to the abnormality detecting unit 42 as the first output.

After switch of the output of the first switching unit 51 up to the eighth diagnostic threshold, an instruction is outputted from the threshold switching unit 41 to the first forced-output unit 55; this instruction instructs the first forced-output unit 55 to output the first forced signal. In the first forced-output unit 55, the instruction causes the switch 55c to be turned on with the switch 55b being kept off so that a signal with the low level is forcibly generated, and, after the lapse of the preset period of time (for example, one clock cycle), causes the switch 55b to be turned on and the switch 55c to be turned off so that a signal with the high level is forcibly generated. The signal whose level is switched from the low level to the high level is outputted from the first monitor circuit 50 to the abnormality detecting unit 42 as the first forced signal.

Figure 5:
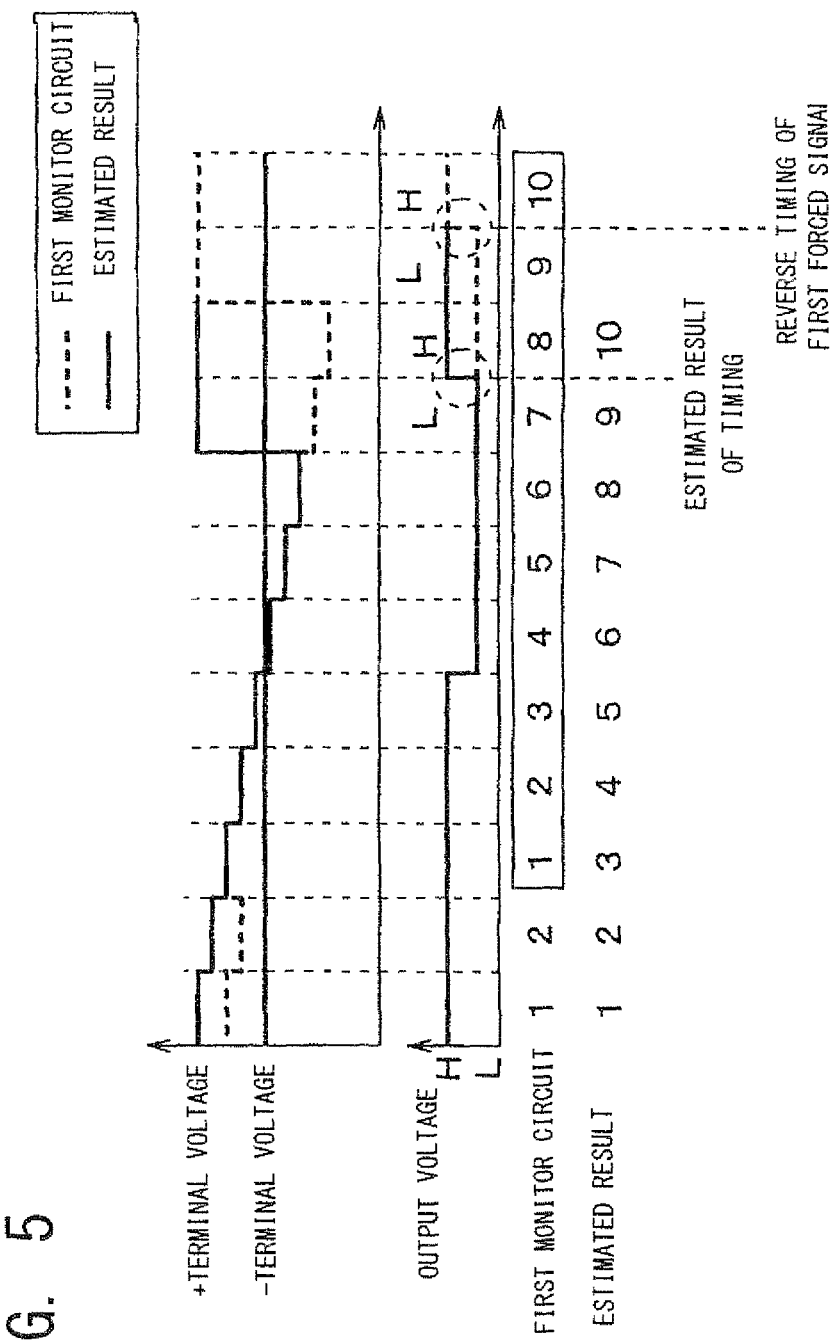
FIG. 5 is a timing chart schematically illustrating input and output timings to the first comparator when the threshold switch timing of the output of the first switching unit from the first diagnostic threshold to the eighth diagnostic threshold is deviated from its normal timing.

At that time, when the threshold switch timing of the output of the first switching unit 51 is not deviated from its normal timing, the timing at which the output of the first switching unit 51 is in agreement with the estimated result of the reverse timing of the output of the first comparator 53 at the switch timing from the fifth diagnostic threshold to the sixth diagnostic threshold (see FIG. 5). In addition, the timing at which the first forced signal is switched from the low level to the high level is in agreement with the estimated result of the level switch timing of the first forced signal at the switch timing from the ninth diagnostic threshold to the tenth diagnostic threshold (see FIG. 5).

Thus, the abnormality detecting unit 42 detects that no characteristic deviations of at least one threshold voltage level from its normal voltage level arises in the first monitor circuit 50, and detects that no characteristic deviations of the threshold switch timing of the output of the first switching unit 51 from their normal values.

On the other hand, let us assume that an abnormality arises in the first monitor circuit 50 so that the characteristic deviation of at least one threshold voltage level from its normal voltage level arises, and the switch timing of the output of the first switching unit 51 is delayed by two steps (two cycles of the clock signal) from its normal timing. In this case, the output of the first switching unit 51 is stepwisely switched from the first diagnostic threshold to the second diagnostic threshold by the threshold switching unit 41.

However, the characteristic deviation of the threshold switch timing of the first monitor circuit 50 from its normal timing arises at the timing when the output of the first switching unit 51 should be switched from the second diagnostic threshold to the third diagnostic threshold. The characteristic deviation causes the first switching unit 51 to set the first diagnostic threshold again so that the threshold voltage level corresponding to the first diagnostic threshold is inputted to the non-inverting input terminal of the first comparator; this threshold voltage level corresponding to the first diagnostic threshold is identical to the threshold voltage level corresponding to the third threshold voltage; this threshold voltage level corresponding to the third threshold voltage could be inputted to the non-inverting input terminal of the first comparator 53 if the threshold switch timing of the first monitor circuit 50 were not deviated from its normal timing.

Thereafter, the stepwise switch of the output of the first switching unit 51 is continued by the threshold switching unit 41 so that, at the timing when the third diagnostic threshold is switched to the fourth diagnostic threshold level, the output of the first comparator 53 is reversed. That is, the reverse timing of the output of the first comparator 53 is in agreement with the estimated reverse timing of the output of the first comparator 53, that is, the switch timing from the fifth diagnostic threshold to the sixth diagnostic threshold. Thus, the abnormality detecting unit 42 determines that the actual reverse timing of the output of the first comparator 53 is in agreement with the estimated reverse timing of the output of the first comparator 53.

After switch of the output of the first switching unit 51 up to the eighth diagnostic threshold, an instruction is outputted from the threshold switching unit 41 to the first forced-output unit 55; this instruction instructs the first forced-output unit 55 to output the first forced signal. In the first forced-output unit 55, the instruction causes the switch 55c to be turned on with the switch 55b being kept off so that a signal with the low level is forcibly generated, and, after the lapse of the preset period of time for example, one clock cycle), causes the switch 55b to be turned on and the switch 55c to be turned off so that a signal with the high level is forcibly generated. The signal whose level is switched from the low level to the high level is outputted from the first monitor circuit 50 to the abnormality detecting unit 42 as the first forced signal.

In the abnormality detecting unit 42, the reverse timing of the first forced signal outputted from the first monitor circuit 50 from the low level to the high level is compared with the estimated reverse timing of the first forced signal. As described above, because the switch timing of the output of the first switching unit 51 is delayed from its normal timing, as illustrated in FIG. 5, the actual reverse timing of the first forced signal is delayed by two cycles of the clock signal from the estimated reverse timing of the first forced signal. Thus, the abnormality detecting unit 42 detects that the characteristic deviation of the threshold switch timing from its normal timing arises in the first monitor circuit 50.

Even if the characteristic deviation of at least one threshold voltage level from its normal voltage level arises in the first monitor circuit 50, the reverse timing of the output of the first comparator 53 can be in agreement with the estimated reverse timing of the output of the first comparator 53. In this case, as illustrated in FIG. 5, the actual reverse timing of the first forced signal is different from the estimated reverse timing of the first forced signal. For this reason, the determination that no characteristic deviations of the threshold switch timing of the output of the first switching unit 51 from their normal values arise in the first monitor circuit 50 is proved to be incorrect.

As described above, the voltage monitor 20 according to the second embodiment is configured to estimate, based on the voltage detector 70 and the estimating unit 43, the reverse timing of the output of the first comparator 53 and the reverse timing of the first forced signal. This configuration allows: the actual reverse timing of the output of the first comparator 53 to be compared with the estimated reverse timing of the output of the first comparator 53, and the actual reverse timing of the first forced signal to be compared with the estimated reverse timing of the first forced signal. This comparison detects the characteristic deviation of at least one threshold voltage level from its normal voltage level and the characteristic deviation of the switch timing of the output of the first switching unit 51 in the first monitor circuit 50.

In each of the first and second embodiments, the voltage monitor 20 is configured to monitor overcharging/overdischarging of the secondary battery as the battery 10, but can be configured to monitor the voltage of the primary battery as the battery 10. When the voltage monitor 20 monitors the battery voltage, a target voltage to be detected can be used as a monitor threshold.

In each of the first and second embodiments, each of the first and second switching units 51 and 61 is configured to switch its output in eight steps from the first diagnostic threshold to the eighth diagnostic threshold, can be configured to switch its output in given steps.

In each of the first and second embodiments, the overdischarging threshold is set to be higher than the first diagnostic threshold, and the overcharging threshold is set to be lower than the eighth diagnostic threshold, but the present invention is not limited to the setting. For example, the overdischarging threshold can be set within a range from the second diagnostic threshold to the third diagnostic threshold, and the overcharging threshold can be set within a range from the sixth diagnostic threshold to the seventh diagnostic threshold.

In each of the first and second embodiments, each of the first and second forced-output units 55 and 65 is provided such that the connection point between the corresponding paired switches is electrically connected with the output terminal of a corresponding one of the first and second comparators 53 and 63, but the present invention is not limited thereto. Specifically, each of the first and second forced-output units 55 and 65 can be provided such that the connection point between the corresponding paired switches is electrically connected with the non-inverting input terminal of a corresponding one of the first and second comparators 53 and 63.

In each of the first and second embodiments, a secondary battery is used as the battery 10; this secondary battery can be applied as an in-vehicle battery to be installed in hybrid motor vehicles or electrical motor vehicles. Specifically, the voltage monitor 20 can be configured to monitor the voltage of a battery installed in a hybrid motor vehicle or an electrical motor vehicle. As described above, even if the battery voltage is kept unchanged, the battery monitor 20 installed in a motor vehicle stepwisely switches the threshold voltage level as the output of each of the first and second switching units 51 and 61 to thereby: determine whether each of the switched threshold voltage levels is deviated from its normal voltage level, and determine whether the timing for each stepwise switch of the threshold voltage level as the output of each of the first and second switching units 51 and 61 is deviated from its normal timing. For this reason, the voltage monitor 20 can carry out the self-diagnostic task set forth above during the motor vehicle being stopped at, for example, a red light, or after an ignition key for energizing the ignition system and other electrical devices installed in the motor vehicle is switched to an OFF position. In this case, because the motor vehicle is not moved, the voltage monitor 20 can carry out the self-diagnostic task without the effect of vehicle noise caused during the motor vehicle running, thus improving the accuracy of determining whether each of the switched threshold voltage levels is deviated from its normal voltage level, and whether the timing for each stepwise switch of the threshold voltage level as the output of each of the first and second switching units 51 and 61 is deviated from its normal timing.

In each of the first and second embodiments, for self diagnosis, the first diagnostic threshold to the eighth diagnostic threshold are stepwisely switched in descending order from the first diagnostic threshold to the eighth diagnostic threshold, but they can be stepwisely switched in ascending order from the eighth diagnostic threshold to the first diagnostic threshold.

Specifically, in each of the first and second embodiments, the output of each of the first and second switching units 51 and 61 is stepwisely switched in descending order among the first diagnostic threshold to the eighth diagnostic threshold so that the first output of the first comparator 53 and the second output of the second comparator 63 are switched from the high level to the low level. For this reason, each of the first and second forced output signals is configured to be shifted from the low level to the high level. However, this configuration is one example of various configurations of each of the first and second forced output signals.

Specifically, when the output of each of the first and second switching units 51 and 61 is stepwisely switched in ascending order among the first diagnostic threshold to the eighth diagnostic threshold so that the first output of the first comparator 53 and the second output of the second comparator 63 are switched from the low level to the high level, each of the first and second forced output signals can be configured to be shifted from the high level to the low level. That is, each of the first and second forced signal preferably consists of a signal with a level being reversed from one of the high and low levels to the other thereof.

In the first embodiment, the output of the first monitor circuit 50 for the single battery 10 and that of the second monitor circuit 60 for the single battery 10 are relatively compared with each other, but, when a plurality of batteries (cells) 10 are electrically connected in series, the voltage monitor 20 can be connected with each of the series-connected batteries 10.

In the second embodiment, the battery monitor 20 monitors the voltage of the single battery 10, but can monitor a plurality of batteries (cells) 10 connected in series. In this modification, the voltage detector 70 is configured to measure the total voltage of the series-connected batteries 10, and the estimating unit 43 can divide the measured total voltage by the number of the series-connected batteries 10 to thereby estimate a voltage of each battery 10.

In each of the first and second embodiments, each of the first and second comparators 53 and 63 is configured to compare a threshold voltage level corresponding to one threshold (divided voltage of the battery voltage) with a corresponding one of the first and second reference voltages, but the present invention is not limited to the configuration.

Figure 6:
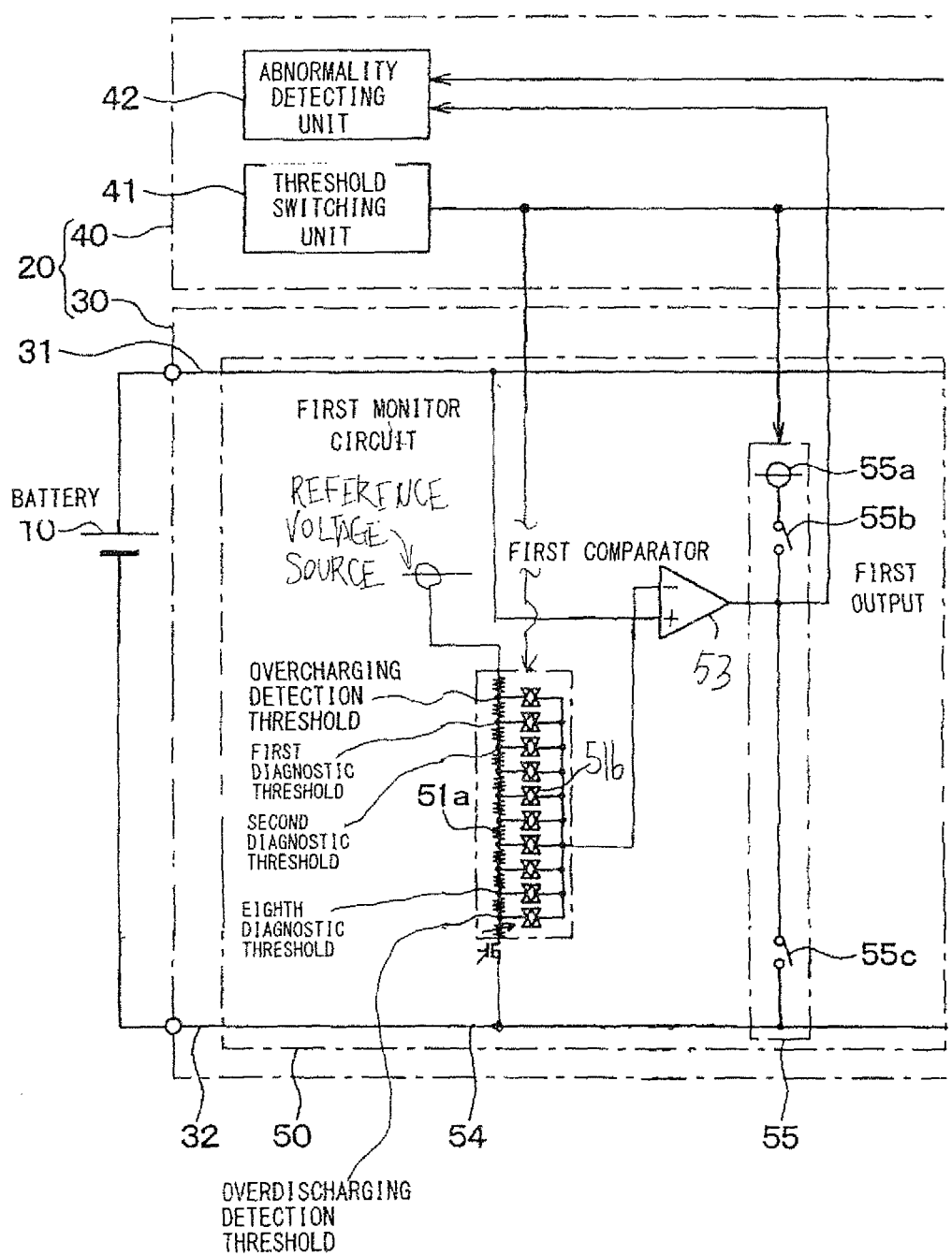
FIG. 6 is a circuit diagram of a part of a voltage monitoring system incorporating a voltage monitor according to a modification of each of the first and second embodiments of the present invention.
Figure 1:
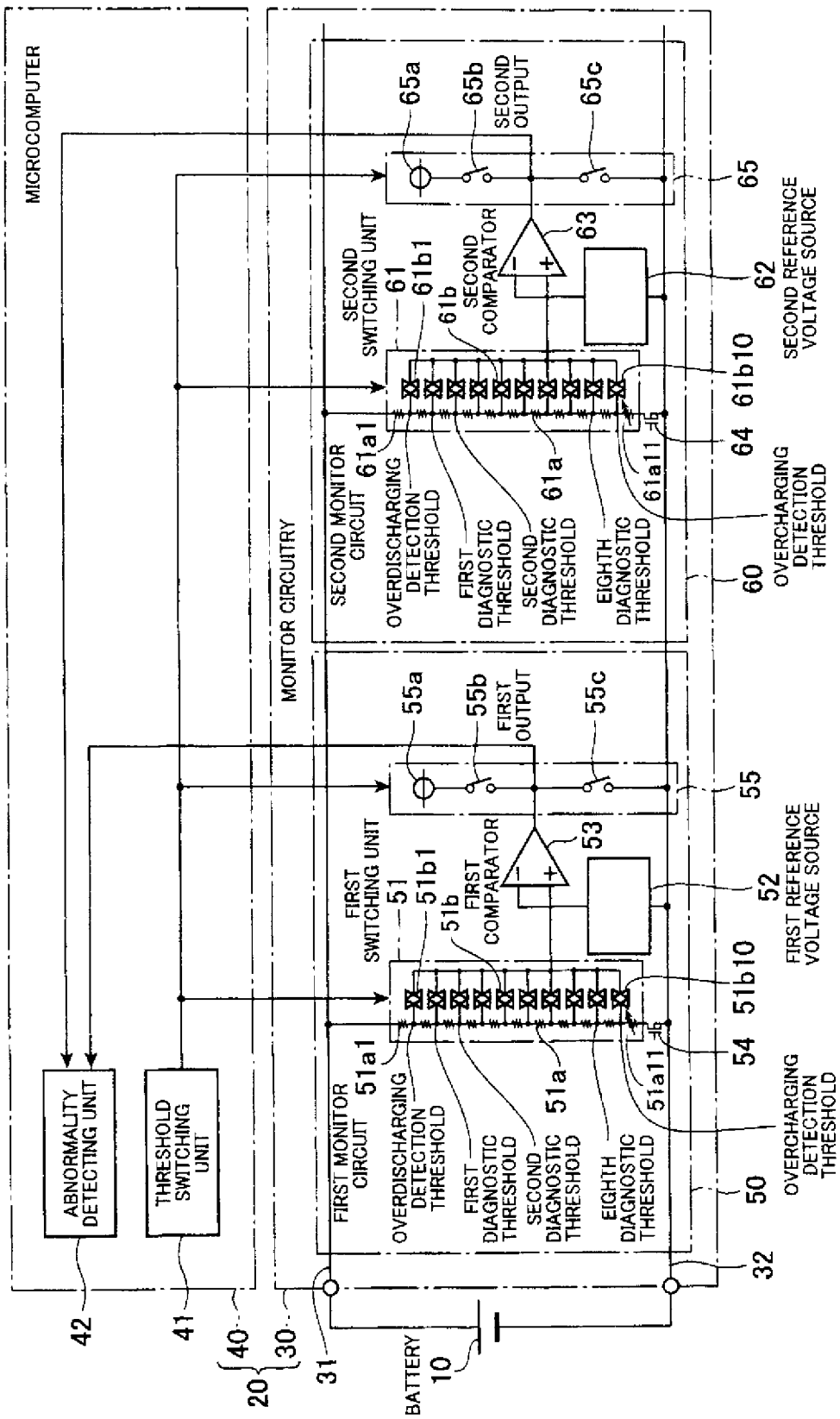
Figure 2:
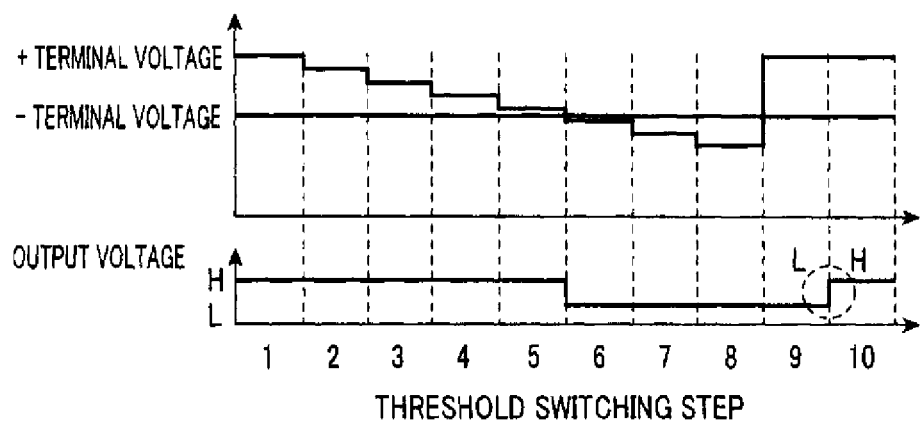
Figure 3:
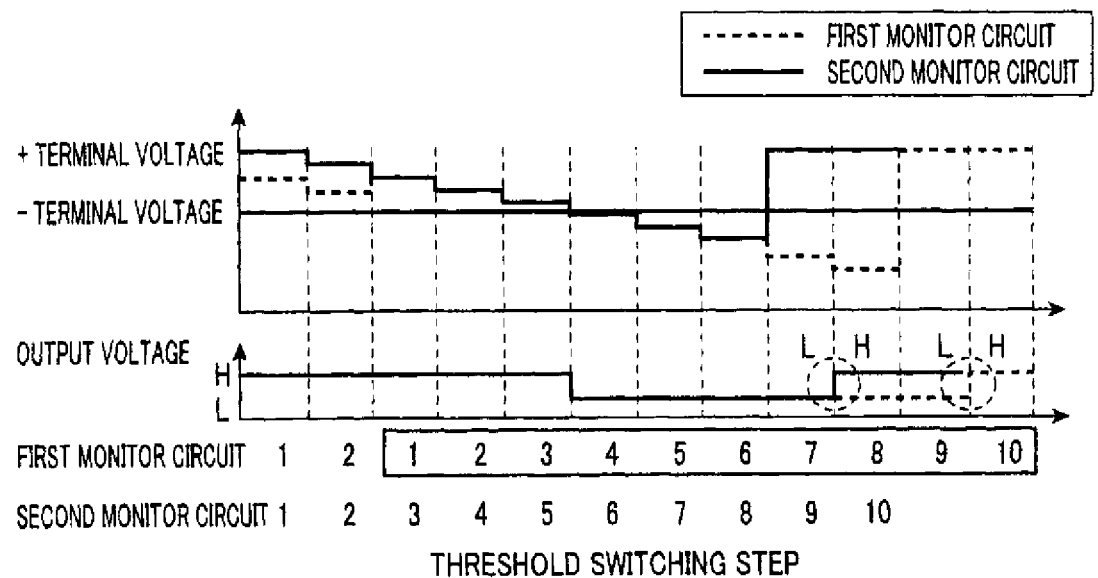
Figure 6:
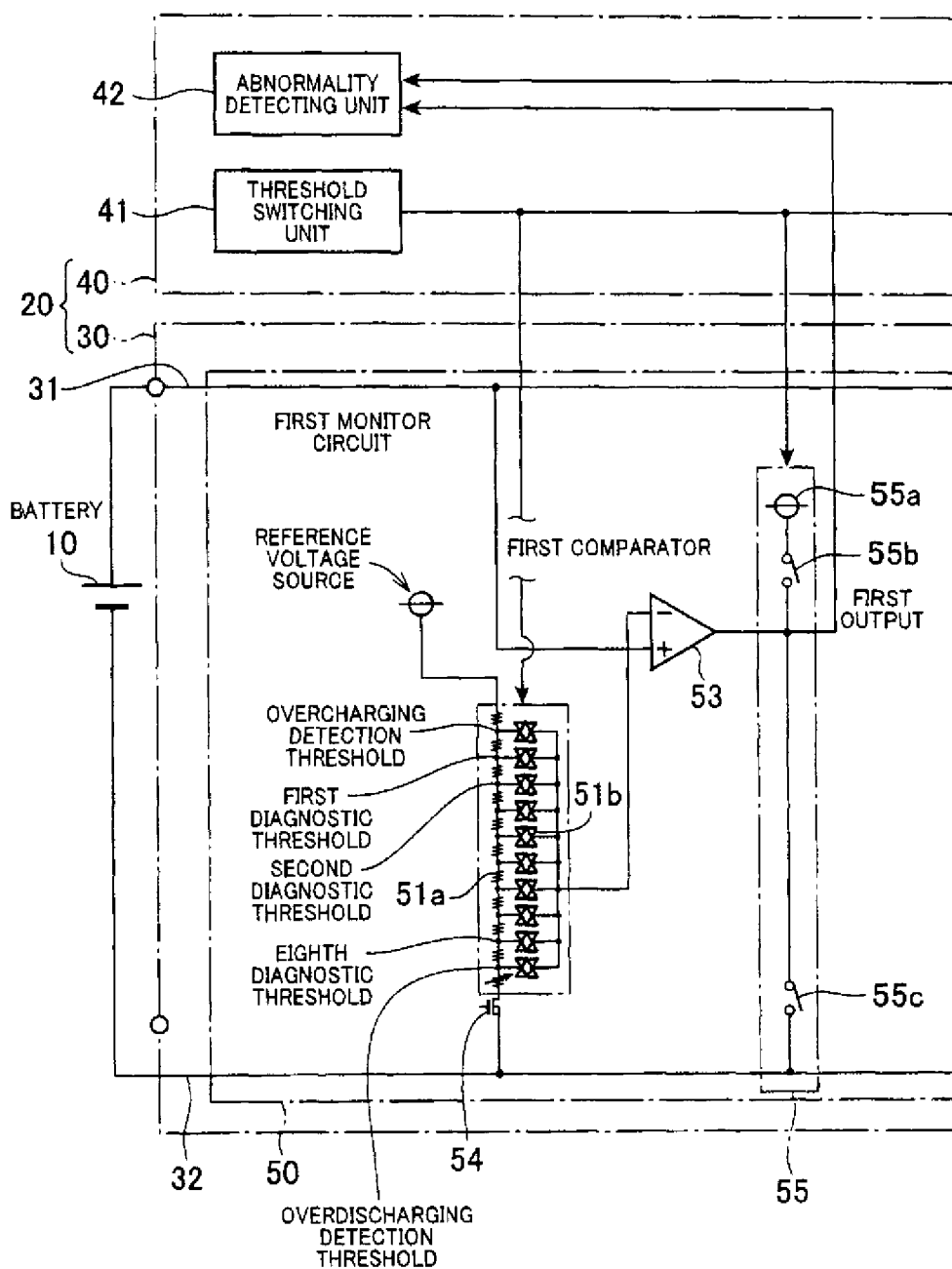

Specifically, as illustrated in FIG. 6, the first comparator 53 can be configured to compare the battery voltage with a threshold voltage level corresponding to any one of the overcharging-detection threshold, the first to eighth diagnostic thresholds, and the overdischarging-detection threshold. The ratio of the resistances of the resistors 51*a*1 to 51*a*11 represents the ratio of at least one of the resistors 51*a*1 to 51*a*11 on the first line side to the remaining resistor(s) on the second line side. In this modification, a voltage corresponding to the overcharging-detection is threshold is obtained by dividing a constant voltage of a voltage source in the ratio of the resistance of the first resistor 51*a*1 to the sum of the resistances of the remaining resistors 51*a*2 to 51*a*11. For example, in this modification, the overcharging-detection threshold is set to, for example, 4.25 V, and the overdischarging-detection threshold is set to, for example, 1.75 V.

The second comparator 63 has the same configuration as the first comparator 53.

While there has been described what is at present considered to be this embodiment and its modifications of the present invention, it will be understood that various modifications which are not described yet may be made therein, and it is intended to cover in the appended claims all such modifications as fall within the scope of the invention.

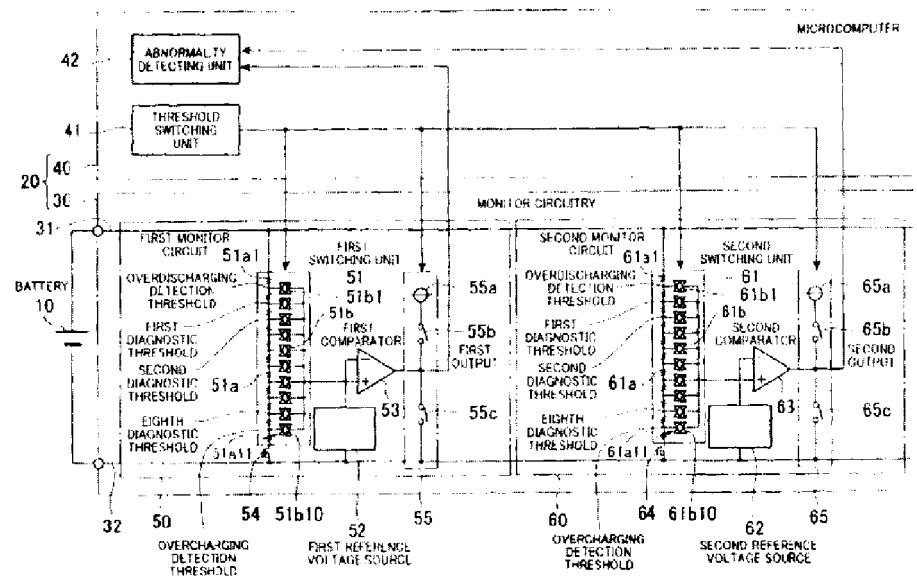

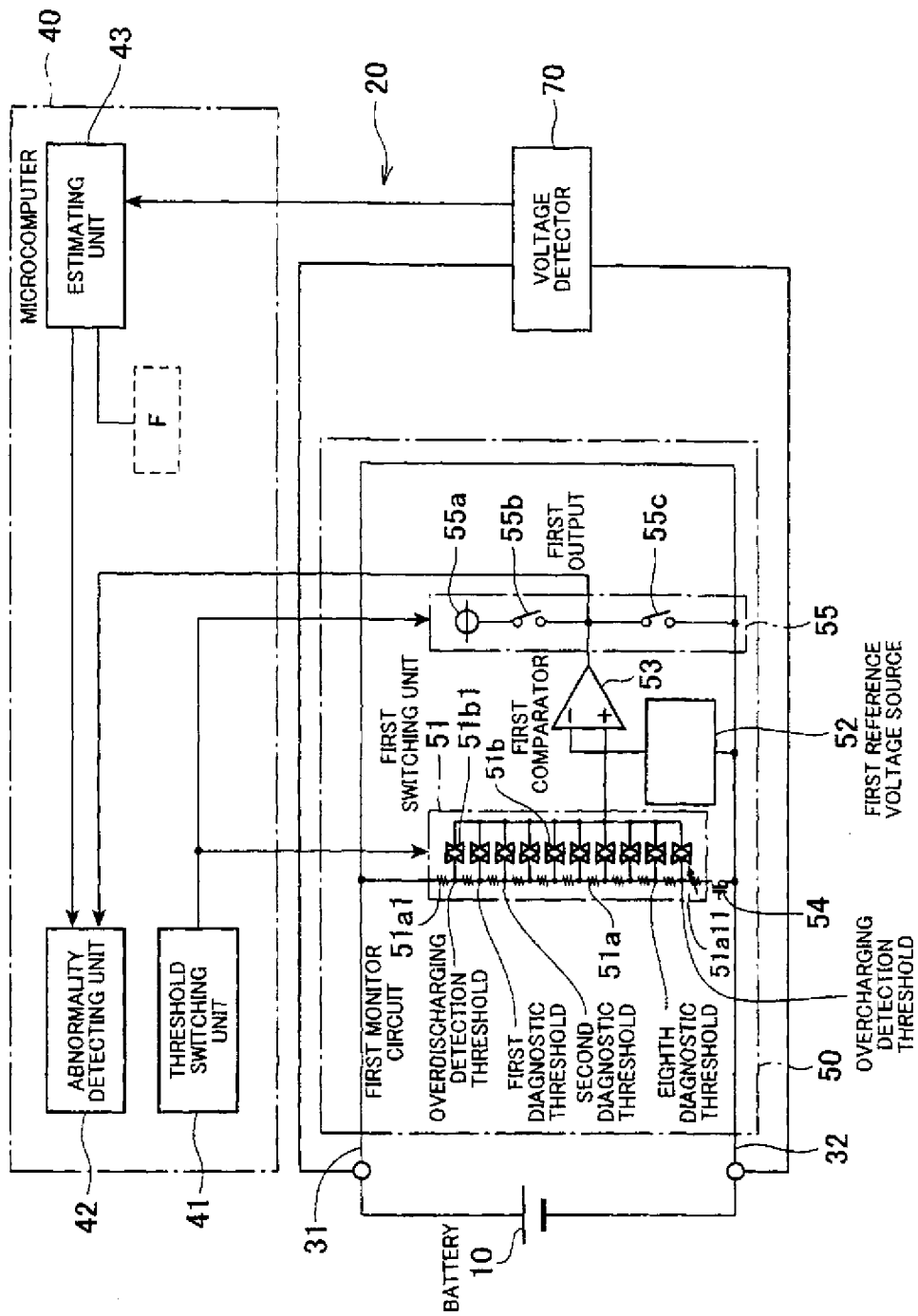

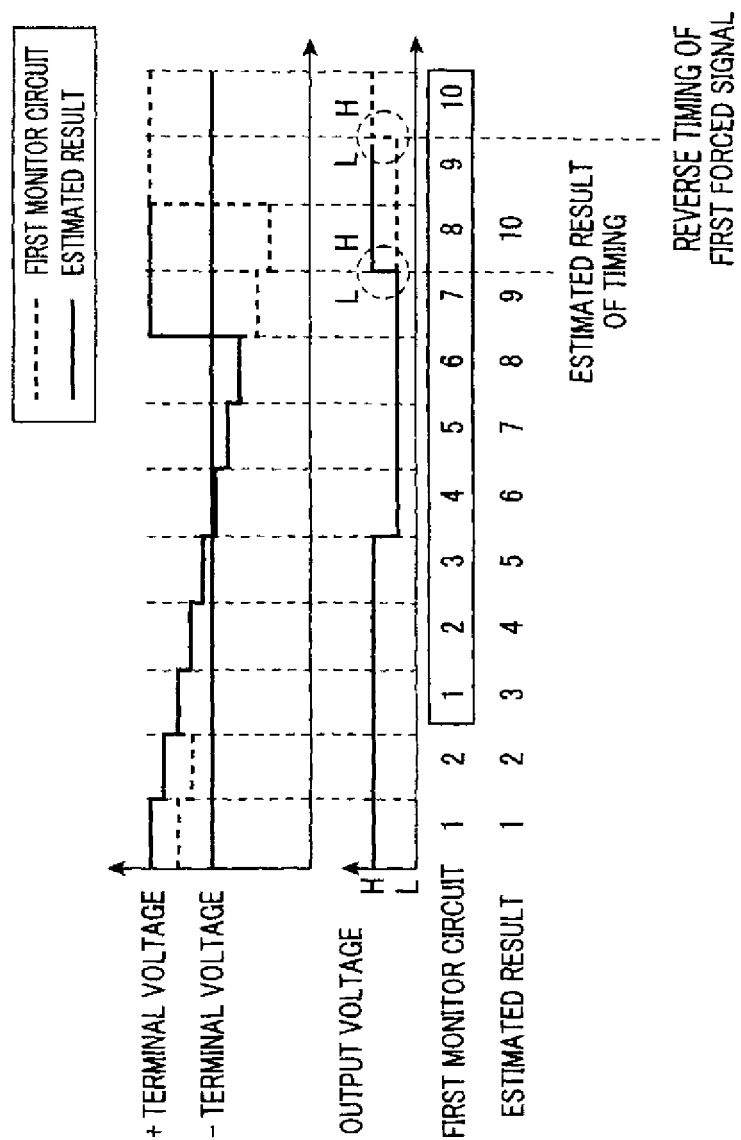

What is claimed is:

1. A voltage monitor for monitoring a voltage of a battery relative to a monitor threshold and for diagnosing the monitor threshold based on each of a first diagnostic threshold and a second diagnostic threshold, the voltage monitor comprising:
    a first obtaining unit configured to obtain a first relative relationship between the battery voltage and one of the monitor threshold and the first diagnostic threshold and to output first information indicative of the first relative relationship;
    a second obtaining unit configured to obtain a second relative relationship between the battery voltage and one of the monitor threshold and the second diagnostic threshold and to output second information indicative of the second relative relationship;
    a threshold switching unit configured to stepwisely switch, by a constant level, a level of each of the first and second diagnostic thresholds when each of the first and second diagnostic thresholds is used by a corresponding one of the first and second obtaining units;
    a first forced-output unit configured to forcibly output a first forced signal when a preset period of time has elapsed since a start of the stepwise switch of the first diagnostic threshold by the threshold switching unit;
    a second forced-output unit configured to forcibly output a second forced signal when the preset period of time has elapsed since a start of the stepwise switch of the second diagnostic threshold by the threshold switching unit; and
    an abnormality detecting unit configured to:
        receive the first information outputted from the first obtaining unit and the second information outputted from the second obtaining unit;
        determine that an abnormality that affects on at least one of the first and second diagnostic thresholds arises in the voltage monitor when the first information is different from the second information;
        receive the first forced signal outputted from the first forced-output unit and the second forced signal outputted from the second forced-output unit; and
        determine whether a timing at which the level of the first diagnostic threshold is switched for each step is deviated from a timing at which the level of the second diagnostic threshold is switched for a corresponding step based on a result of a comparison between the first forced signal and the second forced signal.

2. The voltage monitor according to claim 1, wherein each of the first forced signal and the second forced signal has a level that is reversed from one of a low level and a high level to the other thereof.

3. The voltage monitor according to claim 2, wherein the first obtaining unit is configured to output, as the first information, a first signal with a level being shifted from one of a low level and a high level to the other thereof based on the stepwise switch of the level of the first diagnostic threshold, the second obtaining unit is configured to output, as the second information, a second signal with a level being shifted from one of a low level and a high level to the other thereof based on the stepwise switch of the level of the second diagnostic threshold, and each of the first forced signal and the second forced signal has the level that is reversed from the low level to the high level when the level of each of the first and second signals is shifted from the high level to the low level, and has the level that is reversed from the high level to the low level when the level of each of the first and second signals is shifted from the low level to the high level.

4. The voltage monitor according to claim 1, wherein the level of each of the first and second diagnostic thresholds is a voltage level, and the threshold switching unit is configured to stepwisely switch the level of each of the first and second diagnostic thresholds within a usable voltage range of the battery.

5. The voltage monitor according to claim 1, wherein the first obtaining unit comprises:
    a first voltage divider configured to output a voltage corresponding to each of the monitor threshold and the first diagnostic threshold as a divided voltage of the voltage of the battery;
    a first reference voltage source configured to output a first reference voltage; and
    a first comparator configured to:
        receive the divided voltage outputted from the first voltage divider and the first reference voltage outputted from the first reference voltage source;
        compare the divided voltage with the first reference voltage; and
        output a result of the comparison as the first information,
    and the second obtaining unit comprises:
    a second voltage divider configured to output a voltage corresponding to each of the monitor threshold and the second diagnostic threshold as a divided voltage of the voltage of the battery;
    a second reference voltage source configured to output a second reference voltage; and
    a second comparator configured to:
        receive the divided voltage outputted from the second voltage divider and the second reference voltage outputted from the second reference voltage source;
        compare the divided voltage with the second reference voltage; and
        output a result of the comparison as the second information,
    the threshold switching unit being configured to stepwisely switch a ratio of division of the voltage of the battery to thereby stepwisely switch the level of each of the first and second diagnostic thresholds.

6. The voltage monitor according to claim 1, wherein the first obtaining unit comprises:
    a first voltage divider configured to divide a reference voltage to output a divided voltage corresponding to one of the monitor threshold and the first diagnostic threshold; and
    a first comparator configured to:
        receive the divided voltage outputted from the first voltage divider and the voltage of the battery;
        compare the battery voltage with the divided voltage; and
        output a result of the comparison as the first information,
    and the second obtaining unit comprises:
    a second voltage divider configured to divide the reference voltage to output a divided voltage corresponding to one of the monitor threshold and the second diagnostic threshold; and
    a second comparator configured to:

receive the divided voltage outputted from the second voltage divider and the voltage of the battery;

compare the battery voltage with the divided voltage; and output a result of the comparison as the second information, the threshold switching unit being configured to stepwisely switch a ratio of division of the reference voltage to thereby stepwisely switch the level of each of the first and second diagnostic thresholds.

7. A voltage monitor for monitoring a voltage of a battery relative to a monitor threshold and for diagnosing the monitor threshold based on a diagnostic threshold relative to the voltage of the battery, the voltage monitor comprising:

an obtaining unit configured to obtain a relative relationship between the battery voltage and each of the monitor threshold and the diagnostic threshold and to output first information indicative of the relative relationship;

a threshold switching unit configured to stepwisely switch a level of the diagnostic threshold to be used by the obtaining unit by a constant level;

a voltage detecting unit configured to detect the voltage of the battery and to output the voltage of the battery;

an estimating unit configured to receive the voltage of the battery outputted from the voltage detecting unit, compare the voltage of the battery with the diagnostic threshold to estimate the relative relationship between the battery voltage and the diagnostic threshold, and output second information indicative of the estimated relative relationship;

a forced-output unit configured to forcibly output a forced signal when a preset period of time has elapsed since a start of the stepwise switch of the diagnostic threshold by the threshold switching unit, the estimating unit being configured to estimate, based on the estimated relative relationship between the battery voltage and the diagnostic threshold, a timing at which the forced signal is outputted by the forced-output unit; and an abnormality detecting unit configured to:

receive the first information outputted from the obtaining unit and the second information outputted from the estimating unit;

determine that an abnormality that affects on the diagnostic threshold arises in the voltage monitor when the first information is different from the second information;

receive the forced signal outputted from the forced-output unit; and determine whether a timing at which the level of the diagnostic threshold is switched for each step is deviated from a normal timing for a corresponding step based on a result of a comparison between a timing of the forced output signal to be inputted to the abnormality detecting unit and the estimated timing at which the forced signal is outputted by the forced-output unit.

8. The voltage monitor according to claim 7, wherein the forced signal has a level that is reversed from one of a low level and a high level to the other thereof.

9. The voltage monitor according to claim 8, wherein the obtaining unit is configured to output, as the first information, a signal with a level being shifted from one of a low level and a high level to the other thereof based on the stepwise switch of the level of the diagnostic threshold, and the forced signal has the level that is reversed from the low level to the high level when the level of the signal is shifted from the high level to the low level, and has the level that is reversed from the high level to the low level when the level of the signal is shifted from the low level to the high level.

10. The voltage monitor according to claim 7, wherein the level of each of the first and second diagnostic thresholds is a voltage level, and the threshold switching unit is configured to stepwisely switch the level of the diagnostic threshold within a usable voltage range of the battery.

11. The voltage monitor according to claim 7, wherein the obtaining unit comprises:

a voltage divider configured to output a voltage corresponding to each of the monitor threshold and the diagnostic threshold as a divided voltage of the voltage of the battery;

a reference voltage source configured to output a reference voltage; and a comparator configured to:

receive the divided voltage outputted from the voltage divider and the reference voltage outputted from the reference voltage source;

compare the divided voltage with the reference voltage; and output a result of the comparison as the first information, the threshold switching unit being configured to stepwisely switch a ratio of division of the voltage of the battery to thereby stepwisely switch the level of the diagnostic threshold.

12. The voltage monitor according to claim 7, wherein the obtaining unit comprises:

a voltage divider configured to divide a reference voltage to output a divided voltage corresponding to each of the monitor threshold and the diagnostic threshold; and a comparator configured to:

receive the divided voltage outputted from the voltage divider and the voltage of the battery;

compare the battery voltage with the divided voltage; and output a result of the comparison as the first information, the threshold switching unit being configured to stepwisely switch a ratio of division of the reference voltage to thereby stepwisely switch the level of the diagnostic threshold.

* * * * *

UNITED STATES PATENT AND TRADEMARK OFFICE
CERTIFICATE OF CORRECTION

PATENT NO.         : 8,441,263 B2
APPLICATION NO.    : 12/892053
DATED              : May 14, 2013
INVENTOR(S)        : Mizoguchi It is certified that error appears in the above-identified patent and that said Letters Patent is hereby corrected as shown below:

Delete the title page and substitute therefore the attached title page showing the corrected illustrative figure.

Delete Drawing Sheets 1-5 and substitute therefore the attached Drawing Sheets 1-5.

Signed and Sealed this
Third Day of September, 2013

Teresa Stanek Rea
*Acting Director of the United States Patent and Trademark Office*

(12) United States Patent
Mizoguchi

(10) Patent No.: US 8,441,263 B2
(45) Date of Patent: May 14, 2013

(54) VOLTAGE MONITOR WITH SELF DIAGNOSTIC FUNCTION

(75) Inventor: Tomomichi Mizoguchi, Nagoya (JP)

(73) Assignee: Denso Corporation, Kariya (JP)

(*) Notice: Subject to any disclaimer, the term of this patent is extended or adjusted under 35 U.S.C. 154(b) by 451 days.

(21) Appl. No.: 12/892,053

(22) Filed: Sep. 28, 2010

(65) Prior Publication Data
US 2011/0074435 A1  Mar. 31, 2011

(30) Foreign Application Priority Data
Sep. 29, 2009  (JP) .................. 2009-224953

(51) Int. Cl.
G01N 27/28 (2006.01)
H02J 7/16 (2006.01)
H02J 7/00 (2006.01)

(52) U.S. Cl.
USPC .......... 324/433; 324/426; 320/151; 320/152; 320/153; 320/156; 320/165; 307/66

(58) Field of Classification Search .......... 324/433
See application file for complete search history.

(56) References Cited

U.S. PATENT DOCUMENTS

| | | | |
|---|---|---|---|
| 2004/0001996 A1* | 1/2004 | Sugimoto | 429/61 |
| 2004/0041569 A1* | 3/2004 | Furukawa | 324/433 |
| 2004/0113630 A1* | 6/2004 | Sudou | 324/433 |
| 2005/0248351 A1* | 11/2005 | Graf | 324/433 |
| 2008/0169820 A1* | 7/2008 | Nishimoto | 324/433 |
| 2009/0174411 A1* | 7/2009 | Yudahira et al. | 324/433 |
| 2012/0001639 A1 | 1/2012 | Mizoguchi et al. | |

FOREIGN PATENT DOCUMENTS

| | | |
|---|---|---|
| JP | 2003-092840 | 3/2003 |
| JP | P2011-078163 A | 4/2011 |
| JP | P2011-078165 A | 4/2011 |

OTHER PUBLICATIONS

U.S. Appl. No. 13/499,084 of Tanigawa et al, filed Mar. 29, 2012 (corresponds to JP 2011-078163A).
U.S. Appl. No. 13/206,841 of Mizoguchi et al, filed Aug. 10, 2011 (corresponds to JP 2011-078165A).

* cited by examiner

Primary Examiner — Yalkew Fantu
(74) Attorney, Agent, or Firm — Nixon & Vanderhye PC

(57) ABSTRACT

In a voltage monitor, an abnormality detecting unit receives first information outputted from a first obtaining unit and second information outputted from a second obtaining unit, and determines that an abnormality that affects on at least one of first and second diagnostic thresholds arises in the voltage monitor when the first information is different from the second information. The abnormality detecting unit receives a first forced signal outputted from a first forced-output unit and a second forced signal outputted from a second forced-output unit. The abnormality detecting unit determines whether a timing at which the level of the first diagnostic threshold is switched for each step is deviated from a timing at which the level of the second diagnostic threshold is switched for a corresponding step based on a result of a comparison between the first forced signal and the second forced signal.

12 Claims, 5 Drawing Sheets